US008928057B2

(12) United States Patent  
Cote et al.

(10) Patent No.: US 8,928,057 B2  
(45) Date of Patent: *Jan. 6, 2015

(54) UNIFORM FINFET GATE HEIGHT

(71) Applicant: International Business Machines Corporation, Armonk, NY (US)

(72) Inventors: William Cote, Poughquag, NY (US); Johnathan E. Faltermeier, Delanson, NY (US); Babar A. Khan, Ossining, NY (US); Ravikumar Ramachandran, Pleasantville, NY (US); Theodorus E. Standaert, Clifton Park, NY (US); Xinhui Wang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/689,924

(22) Filed: Nov. 30, 2012

(65) Prior Publication Data

US 2014/0151772 A1    Jun. 5, 2014

(51) Int. Cl.
*H01L 29/94* (2006.01)
*H01L 29/66* (2006.01)
*H01L 21/84* (2006.01)
*H01L 27/12* (2006.01)

(52) U.S. Cl.
CPC ............ *H01L 29/945* (2013.01); *H01L 21/845* (2013.01); *H01L 27/1211* (2013.01); *H01L 29/66181* (2013.01)
USPC ........... 257/301; 257/302; 257/306; 257/308; 257/296; 257/328; 257/329; 257/330; 257/333; 257/532

(58) Field of Classification Search
CPC .................. H01L 27/10829; H01L 27/10861; H01L 29/66181; H01L 29/945; H01L 27/10867
USPC ......................................................... 257/301
See application file for complete search history.

(56) References Cited

U.S. PATENT DOCUMENTS

| 6,620,715 B1* | 9/2003 | Blosse et al. .................. 438/585 |
| 7,125,790 B2 | 10/2006 | Low et al. |
| 8,004,051 B2 | 8/2011 | Denison |
| 8,039,326 B2 | 10/2011 | Knorr et al. |
| 8,093,107 B1 | 1/2012 | Nemati et al. |
| 8,193,067 B2 | 6/2012 | Anderson et al. |
| 8,492,282 B2* | 7/2013 | DeVilliers ...................... 438/703 |
| 2006/0043616 A1* | 3/2006 | Anderson et al. ............. 257/900 |

* cited by examiner

*Primary Examiner* — Thao X Le
*Assistant Examiner* — Long Le
(74) *Attorney, Agent, or Firm* — L. Jeffrey Kelly; Steven Meyers

(57) ABSTRACT

A method including providing fins etched from a semiconductor substrate and covered by an oxide layer and a nitride layer, the oxide layer being located between the fins and the nitride layer, removing a portion of the fins to form an opening, forming a dielectric spacer on a sidewall of the opening, and filling the opening with a fill material, wherein a top surface of the fill material is substantially flush with a top surface of the nitride layer. The method may further include forming a deep trench capacitor in-line with one of the fins, removing the nitride layer to form a gap between the fins and the fill material, wherein the fill material has re-entrant geometry extending over the gap, and removing the re-entrant geometry and causing the gap between the fins and the fill material to widen.

7 Claims, 24 Drawing Sheets

UNIFORM FINFET GATE HEIGHT

BACKGROUND

1. Field of the Invention

The present invention generally relates to integrated circuits, and more particularly to the gate height uniformity of multiple finFET semiconductor devices.

2. Background of Invention

Dimensional uniformity of semiconductor device structures may be desired for optimal functionality. Dimensional variations can affect fabrication and ultimately the reliability of the semiconductor devices, for example finFET devices. Typical process flows used to fabricate finFET devices may produce large variations in gate height. The gate height can vary significantly within a single chip due to a variation in pattern density across the chip. An area of high pattern density may include a plurality of fins whereas an area of low pattern density may include one or two fins. Generally, the gate height measured in areas of low pattern density may be lower than the gate height measured in areas of high pattern density.

Typically, a gate first process flow may include forming fins in a substrate, depositing a gate stack including a high-k dielectric and one or more gate metals, and finally etching the final gate structures. Alternatively, a replacement gate (RG) process flow may include the use of a dummy gate stack. The thickness of the gate stack or the dummy gate stack may vary between areas of high pattern density and areas of low pattern density. It may be understood in the art that active areas may include areas of a chip where one or more semiconductor devices may be formed, whereas non-active areas may include areas of the chip free from semiconductor devices. Furthermore, active areas may have a higher pattern density (e.g. more fins) than non-active areas which may be free of fins.

SUMMARY

According to one embodiment of the present invention, a method is provided. The method may include providing a plurality of fins etched from a semiconductor substrate and covered by an oxide layer and a nitride layer, the oxide layer being located between the plurality of fins and the nitride layer, removing a portion of the plurality of fins to form an opening, forming a dielectric spacer on a sidewall of the opening, filling the opening with a fill material, wherein a top surface of the fill material is substantially flush with a top surface of the nitride layer. The method may further include forming a deep trench capacitor in-line with one of the plurality of fins, removing the nitride layer to form a gap between the plurality of fins and the fill material, wherein the fill material has re-entrant geometry extending over the gap, and removing the re-entrant geometry and causing the gap between the plurality of fins and the fill material to widen.

According to another exemplary embodiment, a structure is provided. The structure may include a first plurality of fins and a second plurality of fins etched from a semiconductor substrate, a deep trench capacitor positioned in-line with, and electrically connected to, one of the plurality of fins, and a fill material located above the semiconductor substrate and between the first plurality of fins and the second plurality of fins, wherein the fill material does not contact either the first plurality of fins or the second plurality of fins.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
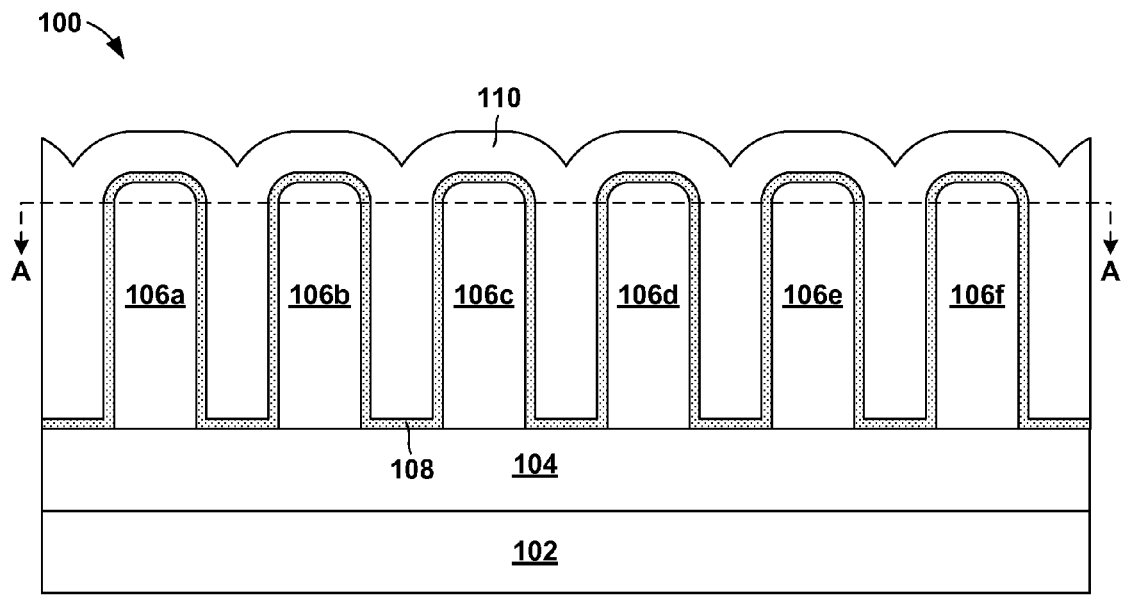
FIG. 1 illustrates a cross-sectional view of a finFET device at an intermediate step of its fabrication according to an exemplary embodiment.
Figure 1A:
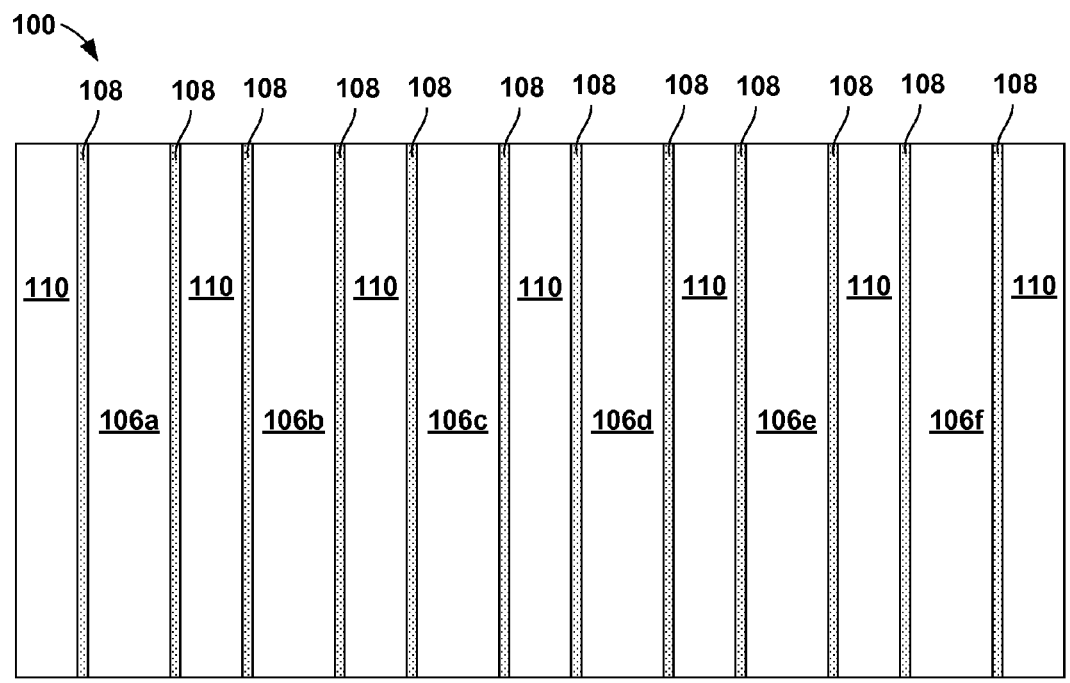
FIG. 1A depicts a section view, section A-A, of FIG. 1 according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The invention relates to the fabrication of finFET devices, and more particularly, to achieving uniform gate heights across multiple groupings of finFETs having varying device densities. The gate height may vary as a result of varying pattern densities, for example, the density of fins patterned in a wafer. It may be advantageous to minimize the variation of gate heights during the formation of finFET devices to reduce subsequent process complexities and improve yield and reliability A finFET device may include a plurality of fins formed in a wafer; a gate covering a portion of the fins, wherein the portion of the fins covered by the gate serves as a channel region of the device and portions of the fins extending out from under the gate serve as source and drain regions of the device; and dielectric spacers on opposite sides of the gate. The present embodiment may be implemented in a gate first or a gate last finFET fabrication process flow, however a gate last, or replacement gate (RG), process flow will be relied upon for the detailed description below.

In a RG process flow, a semiconductor substrate may be patterned and etched to form fins. Next, a dummy gate may be formed in a direction perpendicular to the length of the fins. For example, the dummy gate may be pattered and etched from a blanket layer of polysilicon. A pair of spacers can be disposed on opposite sidewalls of the dummy gate. Later, the dummy gate may be removed from between the pair of spacers, as by, for example, an anisotropic vertical etch process such as a reactive ion etch (RIE). This creates an opening between the spacers where a metal gate may then be formed. Typical integrated circuits may be divided into active areas and non-active areas. The active areas may include finFET devices. Each active area may have a different pattern density, or a different number of finFET devices.

Referring now to FIGS. 1-11, exemplary process steps of forming a structure 100 in accordance with one embodiment of the present invention are shown, and will now be described in greater detail below. It should be noted that FIGS. 1-11 all represent a cross section view of wafer having a plurality of fins 106a-106f formed in a semiconductor substrate. The cross section view is oriented such that a view perpendicular to the length of the plurality of fins 106a-106f is depicted. In the present embodiment, a deep trench capacitor may be incorporated into a modified process flow designed to improve planarity and possibly eliminate a non-planer surface of a fill material caused by variations in pattern density.

A cross section view, section A-A, may be provided for each figure and is designated by the corresponding figure number appended with a capitol latter 'A.' A cross section view, section B-B, may be provided for each figure and is designated by the corresponding figure number appended with a capitol latter 'B.' Furthermore, it should be noted that while this description may refer to some components of the structure 100 in the singular tense, more than one component may be depicted throughout the figures and like components are labeled with like numerals. The specific number of fins depicted in the figures is for illustrative purposes only.

Referring now to FIG. 1, a cross section view of the structure 100 is shown at an intermediate step during the process flow. At this step of fabrication, the structure 100 may generally include the plurality of fins 106a-106f, etched from a substrate, having an oxide layer 108 and a nitride layer 110 deposited thereon.

The semiconductor substrate may include a bulk semiconductor or a layered semiconductor such as Si/SiGe, a silicon-on-insulator (SOI), or a SiGe-on-insulator (SGOI). Bulk semiconductor substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. In the embodiment shown in FIG. 1 a SOI substrate may be used. The SOI substrate may include a base substrate 102, a buried dielectric layer 104 formed on top of the base substrate 102, and a SOI layer (not shown) formed on top of the buried dielectric layer 104. The buried dielectric layer 104 may isolate the SOI layer from the base substrate 102. It should be noted that the plurality of fins 106a-106f may be etched from the uppermost layer of the SOI substrate, the SOI layer.

The base substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 102 may be about, but is not limited to, several hundred microns thick. For example, the base substrate 102 may have a thickness ranging from 0.5 mm to about 1.5 mm.

The buried dielectric layer 104 may include any of several dielectric materials, for example, oxides, nitrides and oxynitrides of silicon. The buried dielectric layer 104 may also include oxides, nitrides and oxynitrides of elements other than silicon. In addition, the buried dielectric layer 104 may include crystalline or non-crystalline dielectric material. Moreover, the buried dielectric layer 104 may be formed using any of several known methods, for example, thermal or plasma oxidation or nitridation methods, chemical vapor deposition methods, and physical vapor deposition methods. The buried dielectric layer 104 may have a thickness ranging from about 5 nm to about 200 nm. In one embodiment, the buried dielectric layer 104 may have a thickness ranging from about 150 nm to about 180 nm.

The SOI layer, for example the plurality of fins 106a-106f, may include any of the several semiconductor materials included in the base substrate 102. In general, the base substrate 102 and the SOI layer may include either identical or different semiconducting materials with respect to chemical composition, dopant concentration and crystallographic orientation. In one particular embodiment of the present invention, the base substrate 102 and the SOI layer include semiconducting materials that include at least different crystallographic orientations. Typically the base substrate 102 or the SOI layer include a {110} crystallographic orientation and the other of the base substrate 102 or the SOI layer includes a {100} crystallographic orientation. Typically, the SOI layer may include a thickness ranging from about 5 nm to about 100 nm. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that the plurality of fins 106a-106f may be etched from the SOI layer. Because the plurality of fins 106a-106f may be etched from the SOI layer, they too may include any of the characteristics listed above for the SOI layer.

The oxide layer 108 may include a silicon oxide or a silicon oxynitride. In one embodiment, the oxide layer 108 can be formed, for example, by thermal or plasma conversion of a top surface of the SOI layer into a dielectric material such as silicon oxide or silicon oxynitride. In one embodiment, the oxide layer 108 can be formed by the deposition of silicon oxide or silicon oxynitride by chemical vapor deposition (CVD) or atomic layer deposition (ALD). The oxide layer 108 may have a thickness ranging from about 1 nm to about 10 nm, although a thickness less than 1 nm and greater than 10 nm may be acceptable. In one embodiment, the oxide layer 108 may be about 5 nm thick.

The nitride layer 110 may include any suitable insulating material such as, for example, silicon nitride. The nitride layer 110 may be formed using known conventional deposition techniques, for example, low-pressure chemical vapor deposition (LPCVD). In one embodiment, the nitride layer 110 may have a thickness ranging from about 5 nm to about 100 nm. In one embodiment, the nitride layer 110 may be about 50 nm thick.

Figure 2:
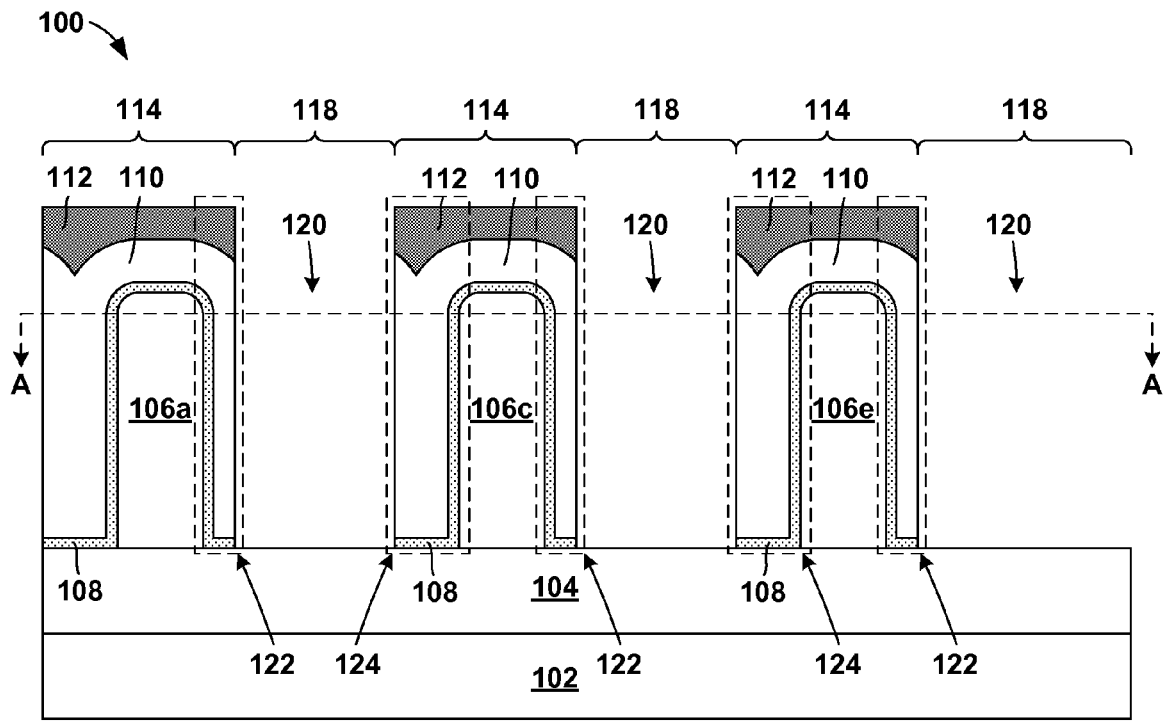
FIG. 2 illustrates the removal of fins to form a non-active area of a chip according to an exemplary embodiment.
Figure 2A:
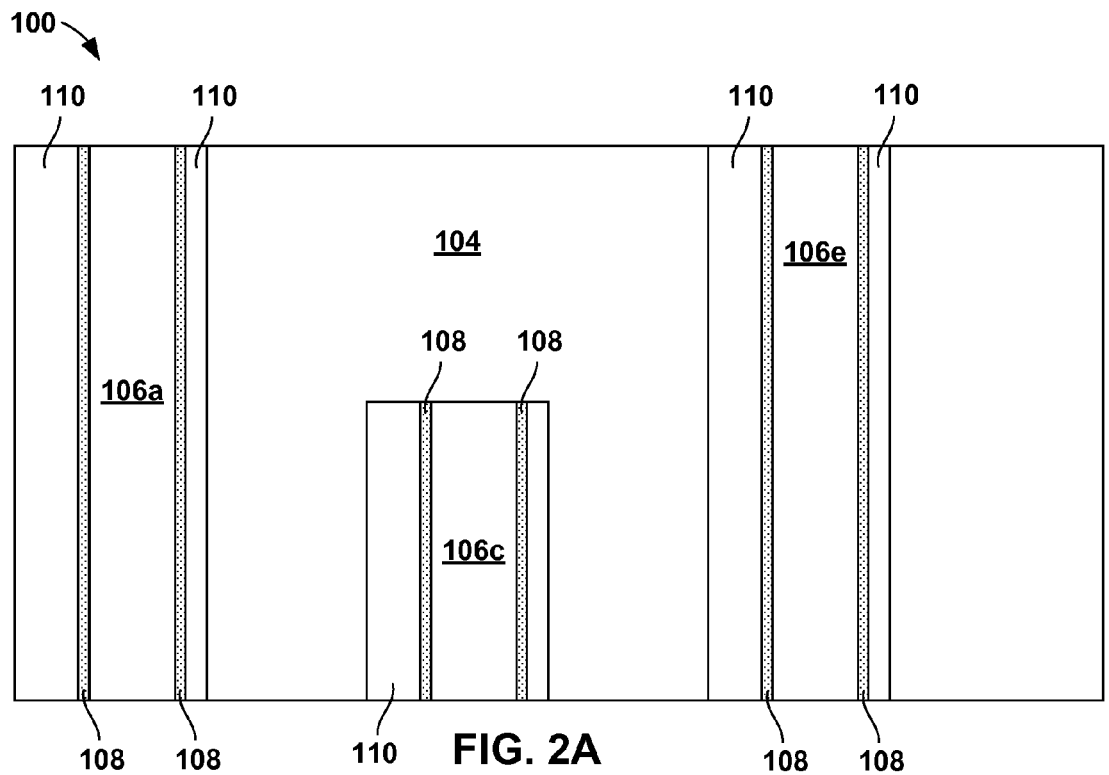
FIG. 2A depicts a section view, section A-A, of FIG. 2 according to an exemplary embodiment.

Referring now to FIG. 2, a mask layer 112 may be applied above the structure 100 and used to form one or more active areas and one or more non-active areas, for example an active area 114, and a non-active area 118. The mask layer 112 can be a soft mask such as photoresist or a hardmask such as an oxide. The mask layer 112 may cover and protect the active area 114 while some of the plurality of fins 106a-106f, the oxide layer 108, and the nitride layer 110 located in the non-active area 118 may be removed. Some of the plurality of fins 106a-106f, the oxide layer 108, and the nitride layer 110 of the non-active area 118 may be removed using any suitable non-selective etching technique such as dry etch, wet etch, or combination of both. For example, a dry etching technique using a $C_xF_y$ based etchant may be used to remove some of the plurality of fins 106a-106f, the oxide layer 108, and the nitride layer 110 from the non-active area 118. The preferred etching technique will remove some of the plurality of fins 106a-106f, the oxide layer 108, and the nitride layer 110 from the non-active area 118 using a single removal technique, and may produce an opening 120. In one embodiment, some of the plurality of fins 106a-106f, the oxide layer 108, and the nitride layer 110 may be individually removed in alternate etching steps. Preferably, the mask layer 112 may be aligned such that a suitable amount of the nitride layer 110 remains on a sidewall of some of the plurality of fins 106a-106f remaining and located in the active area 114. However, alignment of the mask layer 112 may result in some etch error in turn leaving an insufficient amount of the nitride layer 110 along an edge of the active area 114. For example, an edge 122 as depicted in the figure. Conversely, the etch error, for example the error in edge placement, may leave a more than suitable amount of the nitride layer 110 along a second edge 124 as depicted in the figure. See also the section view, section A-A, depicted in FIG. 2A.

Figure 3:
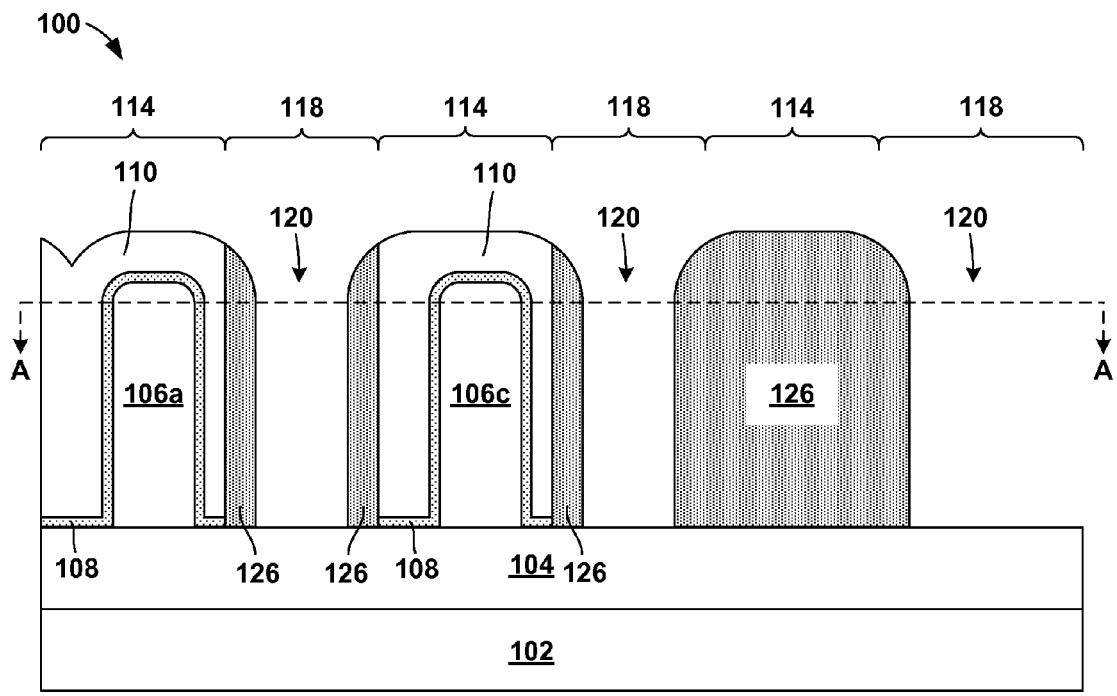
FIG. 3 illustrates the formation of dielectric spacers according to an exemplary embodiment.

Referring now to FIG. 3, one or more dielectric spacers may be formed along the sidewalls of the non-active areas, for example a dielectric spacer 126 may be formed along the sidewalls of the opening 120. The dielectric spacer 126 may typically be used to ensure a suitable amount of dielectric material protects the plurality of fins 106a-106f of the active area 114. More specifically, the dielectric spacer 126 may be formed to add a suitable amount of dielectric material to any area of the active area 114 where an insufficient amount of dielectric material remains, for example along the first edge 122 shown in FIG. 2.

Figure 3A:
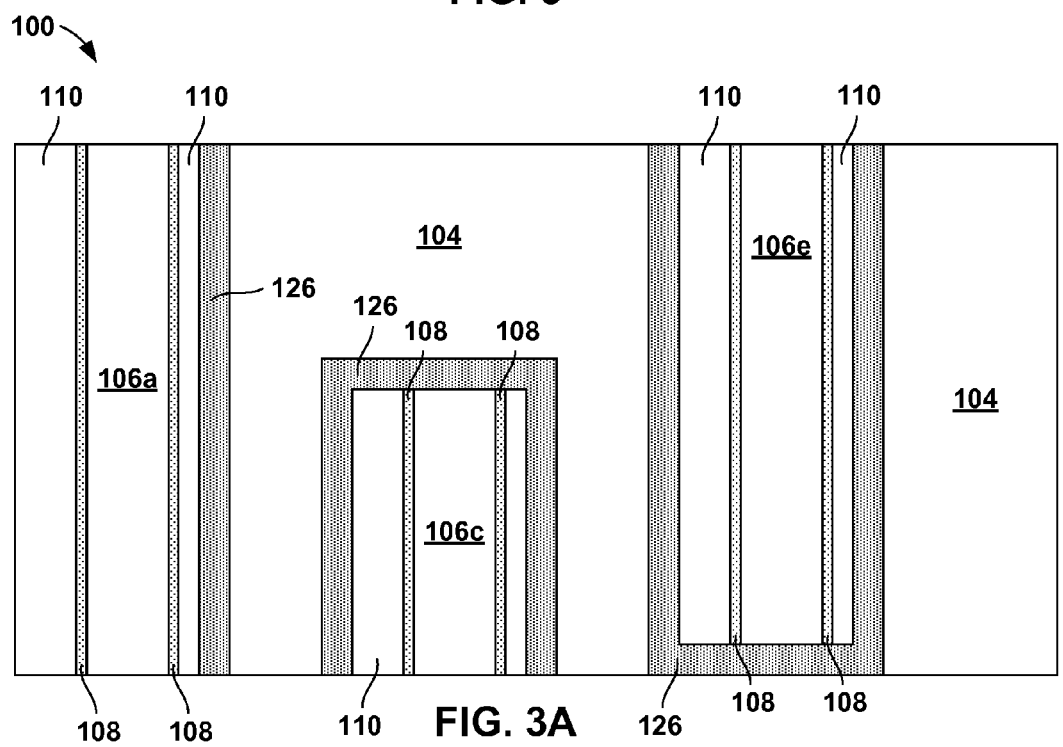
FIG. 3A depicts a section view, section A-A, of FIG. 3 according to an exemplary embodiment.

The dielectric spacer 126 may be formed by conformally depositing or growing a dielectric, followed by a directional etch that removes the dielectric from the horizontal surfaces of the structure 100 while leaving it on the sidewalls of the opening 120. In one embodiment, the dielectric spacer 126 may include any suitable nitride. In one embodiment, the dielectric spacer 126 may have a horizontal width, or thickness, ranging from about 3 nm to about 30 nm, with 10 nm being most typical. In one embodiment, the dielectric spacer 126 may include a similar material as the nitride layer 110. Typically, the dielectric spacer 126 may include a single layer; however, the dielectric spacer 126 may include multiple layers of dielectric material. See also the section view, section A-A, depicted in FIG. 3A.

Figure 4:
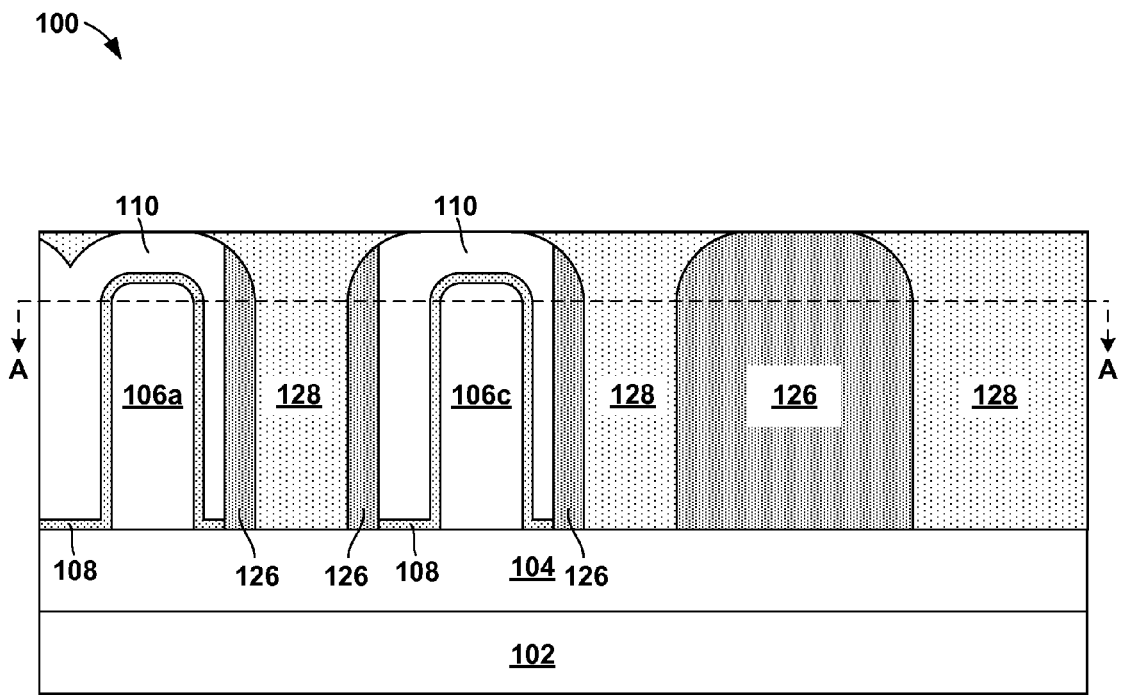
FIG. 4 illustrates the deposition of a fill material according to an exemplary embodiment.

Referring now to FIG. 4, a fill material 128 may be deposited on top of the structure 100 using any suitable deposition technique known in the art. The fill material 128 should serve to fill in the non-active area. In one embodiment, the fill material 128 may include any suitable oxide material know in the art. In one embodiment, the fill material 128 may include a high aspect ratio oxide deposited using a CVD deposition technique. The fill material 128 may have a thickness ranging from about 50 nm to about 1000 nm. In one embodiment, the fill material 128 may have a thickness ranging from about 200 nm to about 600 nm. Preferably, the fill material 128 may have a thickness greater than the height of the nitride layer 110.

Figure 4A:
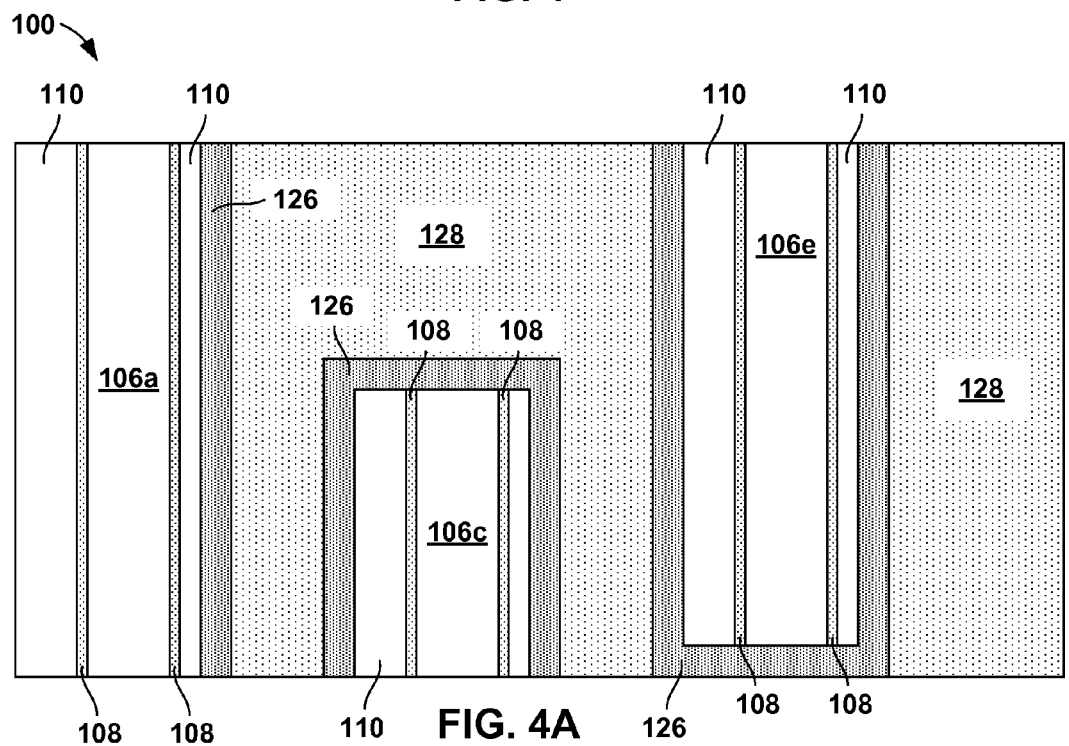
FIG. 4A depicts a section view, section A-A, of FIG. 4 according to an exemplary embodiment.

After being deposited on top of the structure 100, the fill material 128 may be planarized using a CMP technique. The CMP technique may remove some of the fill material 128 selective to the nitride layer 110. In one embodiment, the CMP technique may use a ceria based slurry to recess the fill material 128. Before being polished, the fill material 128 may be non-planar due to variations in pattern density. For example, see FIG. 18. The CMP technique used to polish the fill material 128 may be designed to improve planarity and may advantageously eliminate the non-planer surface of the fill material 128 caused by the variations in pattern density. See also the section view, section A-A, depicted in FIG. 4A.

Figure 5:
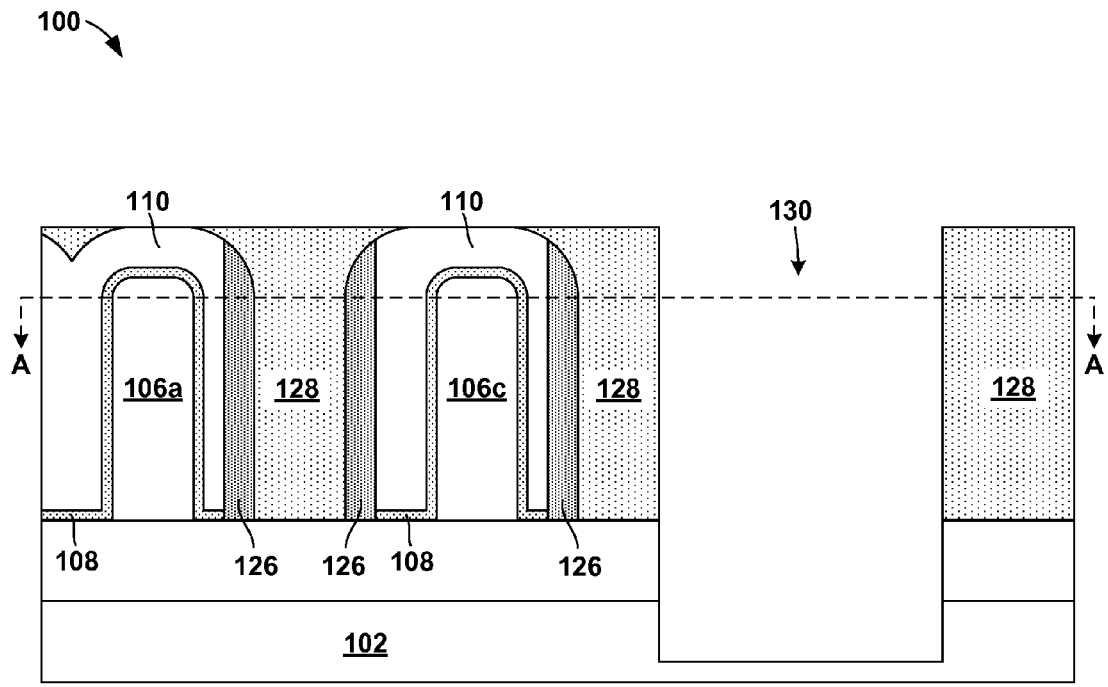
FIG. 5 illustrates the formation of a deep trench in-line with a fin according to an exemplary embodiment.

Referring to FIG. 5, a deep trench 130 may then be formed using known patterning techniques, such as for example, a lithography technique followed by etching technique. The term "deep trench" denotes a trench formed in a semiconductor substrate having a sufficient depth to form a capacitor. As such, a deep trench may typically denote a trench having a depth equal to or greater than 1 micron, whereas a shallow trench may typically refer to a trench having a depth less than 1 micron. While the present embodiment may be described with a deep trench, the present embodiment may be employed with a trench having any depth into the substrate. Such variations are explicitly contemplated herein. In one embodiment, the deep trench 130, shown in FIG. 5, may have a depth sufficient to pass through the buried dielectric layer 104 and extend into the base substrate 102.

Figure 5A:
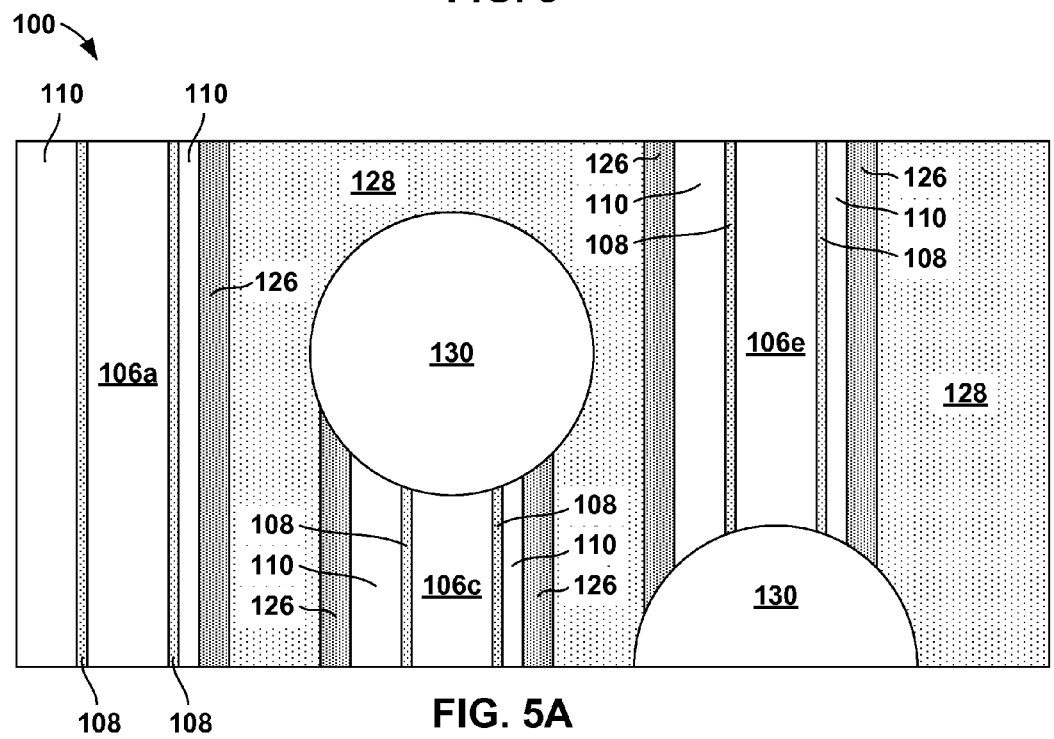
FIG. 5A depicts a section view, section A-A, of FIG. 5 according to an exemplary embodiment.

The lithography technique may include applying a photoresist (not shown) to an upper surface of the structure 100, exposing the photoresist to a desired pattern of radiation and developing the exposed photoresist utilizing a typical resist developer. The pattern in the photoresist may then be transferred to the underlying structure using one or more dry etching techniques to form the deep trench 130. Suitable dry etching techniques may include, but are not limited to: reactive ion etching (RIE), ion beam etching, plasma etching, or laser ablation. The patterned photoresist may then be removed by resist stripping after etching has been completed. The deep trench 130 may be formed directly in line with one of the plurality of fins 106a-106f. Formation of the deep trench 130 directly in line with a fin may facilitate forming an electrical connection between that fin and a subsequently formed deep trench capacitor. See also the section view, section A-A, depicted in FIG. 5A.

Figure 6:
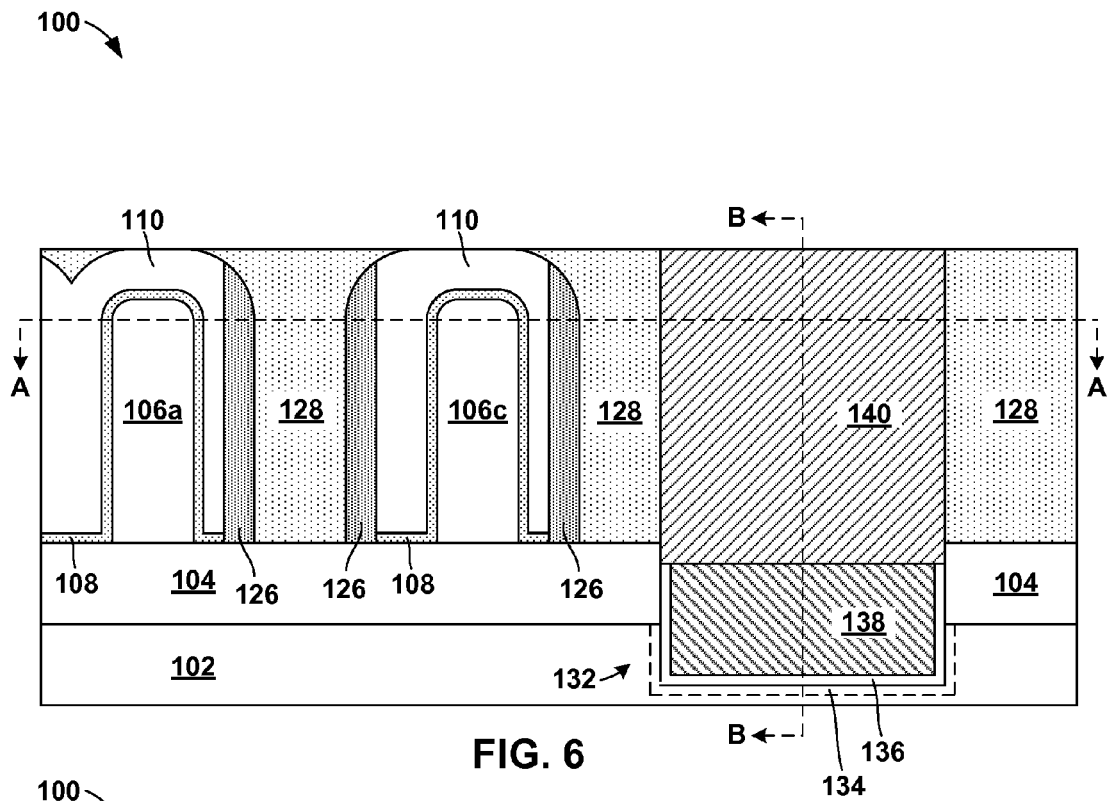
FIG. 6 illustrates the formation of a deep trench capacitor according to an exemplary embodiment.

Referring to FIG. 6, a deep trench capacitor 132 may be formed in the deep trench 130, shown in FIG. 5. The deep trench capacitor 132 may include a buried plate 134, a node dielectric 136, and an inner electrode 138. The buried plate 134 and the inner electrode 138 may serve as the two electrical conductors and the node dielectric 136 may serve as the insulator between the two conductors.

A blanket doping technique may be used to form the buried plate 134. Suitable doping techniques may include, but are not limited to, ion implantation, gas phase doping, plasma doping, plasma immersion ion implantation, cluster doping, infusion doping, liquid phase doping, solid phase doping, or any suitable combination of those techniques. In one embodiment, dopants may be implanted by one or more rounds of angled ion implantation to dope the sidewalls and the bottom of the deep trench 130, shown in FIG. 5. In doing so, dopants may be introduced into the substrate to form the buried plate 134. Typical dopants may include As, P, Sb, B, Ga, and In.

During the multiple rounds of angled ion implantation, the direction and the tilt of the implanted ions may be changed so that the buried plate 134 surrounds the perimeter of the deep trench 130, shown in FIG. 5, at any depth between the top surface of the buried dielectric layer 104 and the bottom surface of the deep trench 130, shown in FIG. 5. The angle of implantation, as measured from a vertical line, may range from about 1 degree to about 5 degrees, and typically from 2 degrees to about 3 degrees, although lesser and greater angles may be explicitly contemplated. The dose and energy of the angled ion implantation may be selected to provide a sufficiently high dopant concentration and volume to the buried plate 134, which may be typically expanded during subsequent thermal treatments. Typical dopant concentration of the buried plate 134 after thermal treatments may range from about $1.0 \times 10^{18}/cm^3$ to about $1.0 \times 10^{21}/cm^3$, although higher and lower dopant concentrations may be explicitly contemplated.

Lateral thickness of the buried plate 134, as measured from the sidewall of the deep trench 130, shown in FIG. 5, to an outer wall of the buried plate 134, prior to a thermal treatment, may range from about 5 nm to about 100 nm, and typically from about 10 nm to about 50 nm, although lesser and greater thicknesses may be explicitly contemplated. Lateral thickness of the buried plate 134, after a thermal treatment, may range from about 5 nm to about 300 nm, and typically from about 10 nm to about 150 nm, although lesser and greater thicknesses mat be explicitly contemplated. Alternatively, the buried plate 134 may include a layer of conductive material conformally deposited within the deep trench 130, shown in FIG. 5.

With continued reference to FIG. 6, the node dielectric 136 may then be formed within the deep trench 130, shown in FIG. 5, and directly on the buried plate 134. The node dielectric 136 may include a dielectric material such as silicon oxide, silicon nitride, silicon oxynitride. The thickness of the node dielectric 136 may range from about 2 nm to about 6 nm. Alternately, the node dielectric 136 may include a high-k material having a dielectric constant greater than the dielectric constant of silicon nitride, which is about 7.5. Exemplary high-k materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x may independently range from about 0.5 to about 3, and each value of y may independently range from 0 to about 2. In this case, the thickness of the node dielectric 136 may range from about 2 nm to about 4 nm, although lesser and greater thickness may be contemplated. In one embodiment, the node dielectric 136 may include a combination of multiple materials or multiple layers of materials.

Next, the inner electrode 138 may be formed by depositing a conductive material on the inner walls of the node dielectric 136. The inner electrode 138 may be a doped semiconductor material or a metal. If the inner electrode 138 is a doped semiconductor material, the doped semiconductor material may include any suitable material commonly used in bulk semiconductor substrates, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. The dopants may be a p-type dopant or an n-type dopant. The doped semiconductor material may be deposited by a chemical vapor deposition technique such as low pressure chemical vapor deposition (LPCVD).

If the inner electrode 138 is an elemental metal, exemplary elemental metals may include Ta, Ti, Co, and W. Alternatively, the inner electrode 138 may be a conductive metallic alloy, and exemplary conductive metallic alloys may include a mixture of elemental metals and a conductive metallic nitride such as TiN, ZrN, HfN, VN, NbN, TaN, WN, TiAlN, TaCN, or alloy thereof. The inner electrode 138 may be formed by any known suitable deposition technique, for example, chemical vapor deposition (CVD), physical vapor deposition (PVD), or atomic layer deposition (ALD). Excess conductive material that may be deposited outside the deep trench 130, shown in FIG. 5, may be removed by a recess etch or a chemical mechanical planarization technique.

Figure 6A:
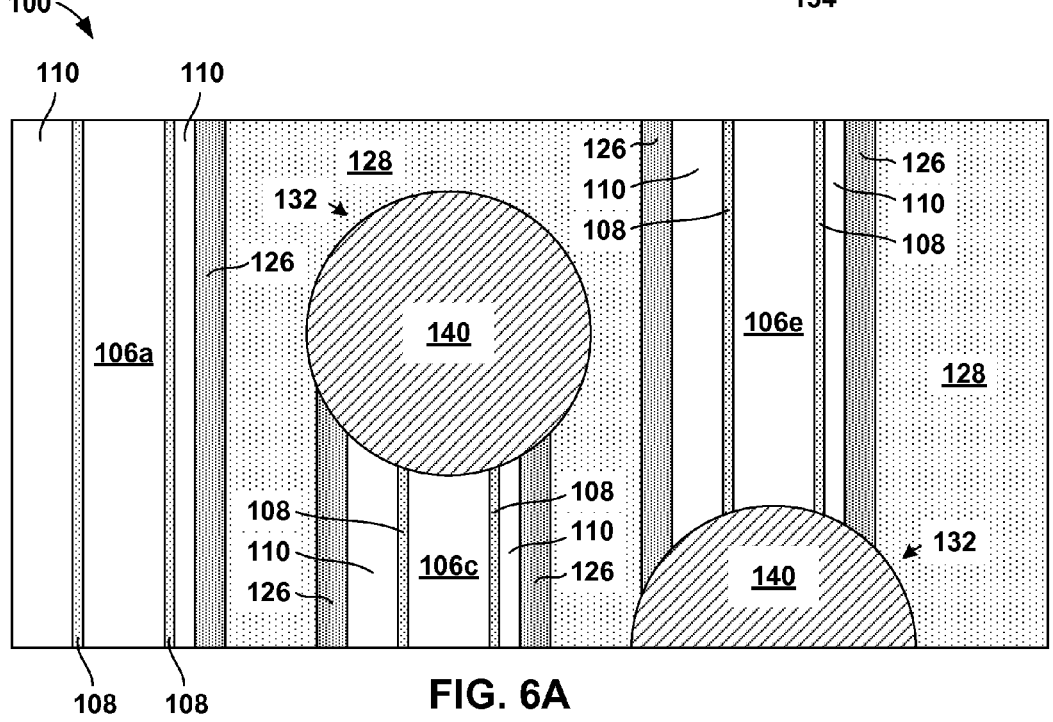
FIG. 6A depicts a section view, section A-A, of FIG. 6 according to an exemplary embodiment.
Figure 6B:
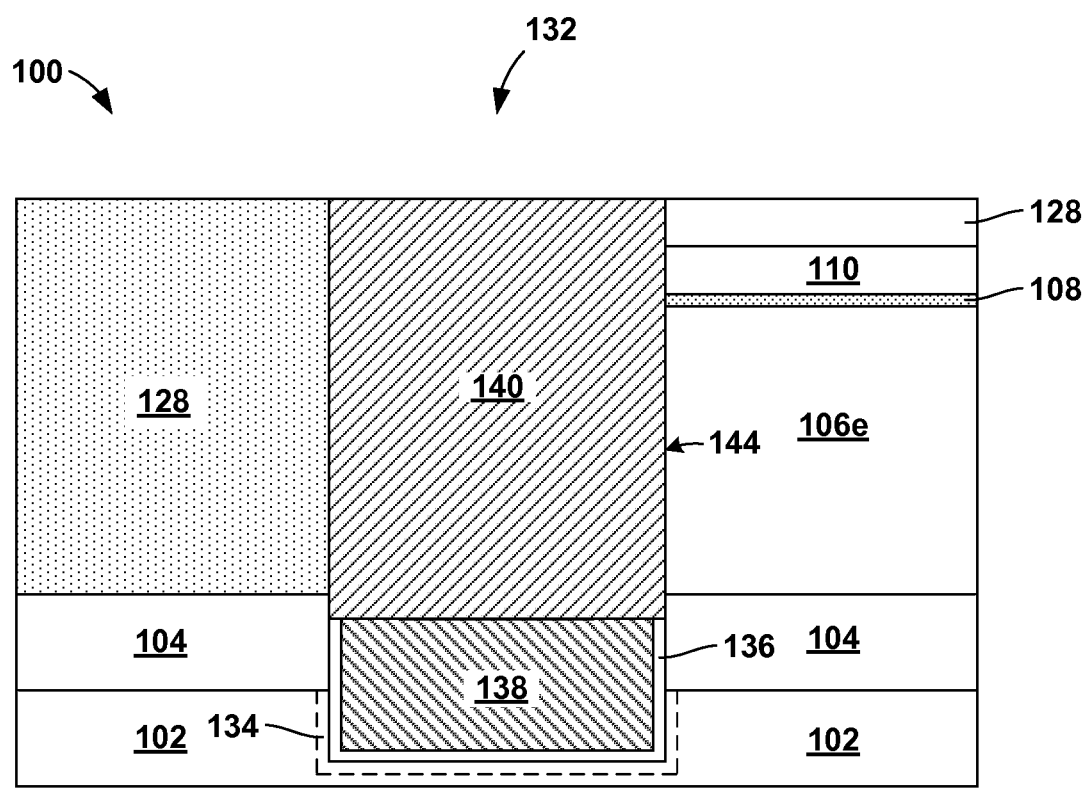
FIG. 6B depicts a section view, section B-B, of FIG. 6 according to an exemplary embodiment.

Next, the node dielectric 136 and the inner electrode 138 may be recessed using any suitable wet or dry etching technique known in the art. Suitable dry etching techniques may include, but are not limited to: reactive ion etching (RIE), ion beam etching, plasma etching, or laser ablation. The node dielectric 136 and the inner electrode 138 may be recessed to a location at least below a top surface of the buried dielectric layer 104 and above a top surface of the base substrate 102. In one embodiment, the node dielectric 136 and the inner electrode 138 may be recessed to a depth ranging from about 50 nm to about 100 nm below the top surface of the buried dielectric layer 104, however the preferred recess depth may be dependant on the thickness of the buried dielectric layer 104. In one embodiment, a dry etching technique, for example reactive ion etch, may be used to recess the node dielectric 136 and the inner electrode 138 to a location within the buried dielectric layer 104. Once the node dielectric 136 and the inner electrode 138 are recessed the remaining space at the top of the deep trench capacitor 132 may be filled with a conductive fill material 140. The conductive fill material 140 may be in direct contact with the end of a fin because, as mentioned above, the deep trench 130, shown in FIG. 5, may be formed directly in line with that fin. For example, the deep trench capacitor 132 may be formed directly in line with the fin 106e. See FIG. 5A. The conductive fill material 140 may facilitate an electrical connection between the inner electrode 138 of the deep trench capacitor 132 and the fin 106e. See also the section view, section A-A, depicted in FIG. 6A, and the section view, section B-B, depicted in FIG. 6B. The electrical connection between the conductive fill material 140 and the fin 106e is depicted in FIG. 6B. The electrical connection may be formed along an intersection 144 between the conductive fill material 140 and the fin 106e as depicted in FIG. 6B.

Figure 7:
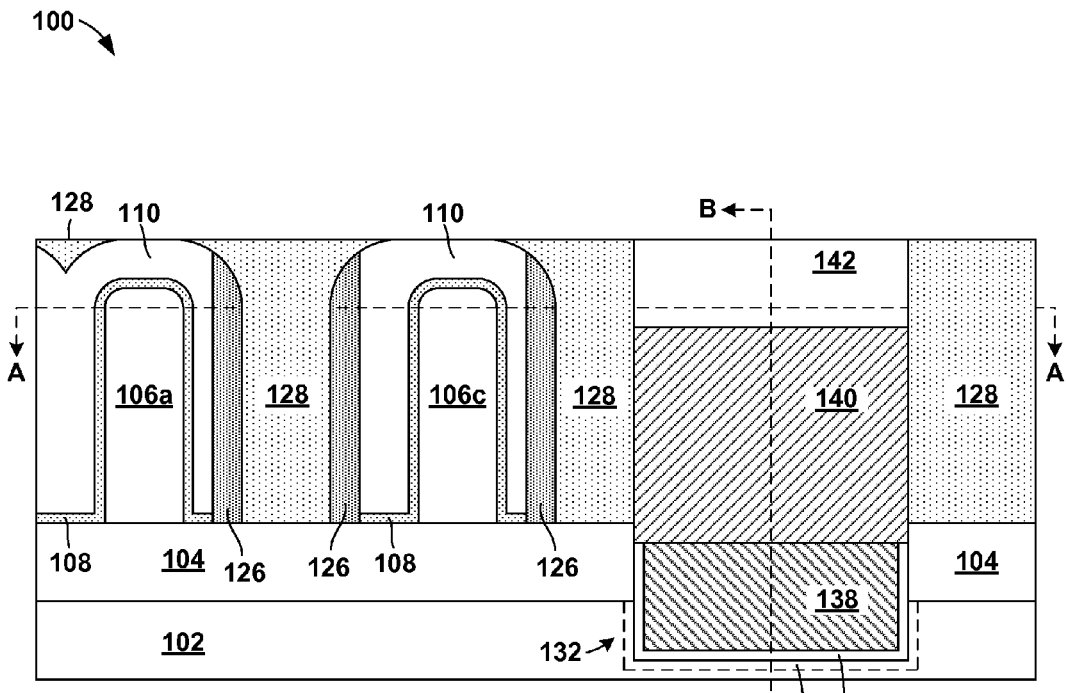
FIG. 7 depicts the formation of a dielectric cap according to an exemplary embodiment.

Referring now to FIG. 7, next, a dielectric cap 142 may be formed at the top of the deep trench capacitor 132. Preferably, the dielectric cap 142 is an oxide and may be formed by any suitable etching and deposition techniques known in the art. First, the conductive fill material 140 may be recessed by any suitable wet or a dry etching technique known in the art. Suitable dry etching techniques may include, but are not limited to: reactive ion etching (RIE), ion beam etching, plasma etching, or laser ablation. In one embodiment, a RIE technique may be used to recess the conductive fill material 140 to a location at or below the top surface of the plurality of fins 106a-106f. The dielectric cap 142 may then be deposited within the recessed opening.

Figure 7A:
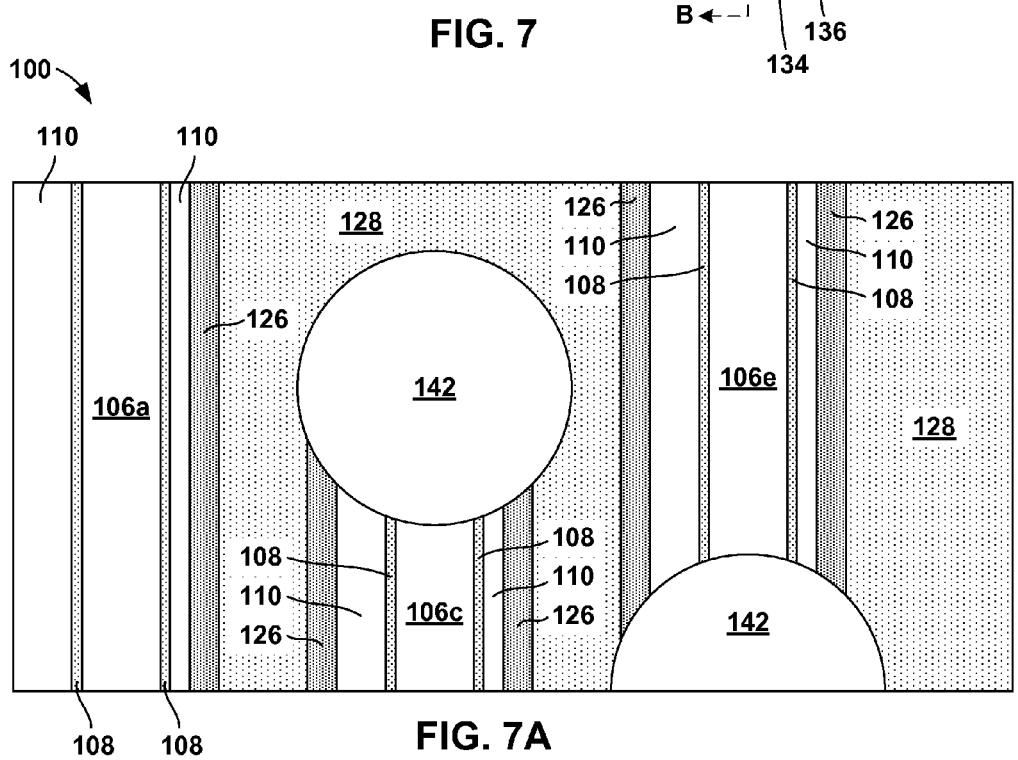
FIG. 7A depicts a section view, section A-A, of FIG. 7 according to an exemplary embodiment.
Figure 7B:
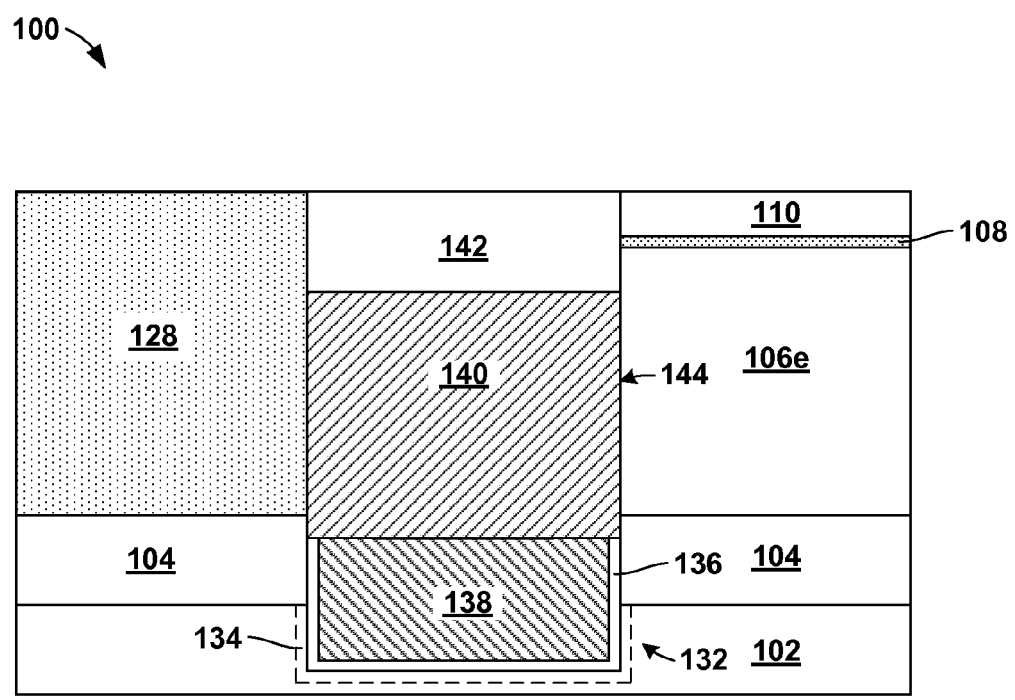
FIG. 7B depicts a section view, section B-B, of FIG. 7 according to an exemplary embodiment.

The dielectric cap 142 may include a dielectric oxide such as silicon oxide, silicon oxynitride, or high-k materials. The dielectric cap 142 may be formed by any known suitable deposition technique, for example, thermal oxidation, chemical vapor deposition (CVD), physical vapor deposition (PVD), or atomic layer deposition (ALD). In one embodiment, the thickness of the dielectric cap 142 may range from about 10 nm to about 100 nm, and typically from about 30 nm to about 60 nm, although lesser and greater thicknesses may be explicitly contemplated. See also the section view, section A-A, depicted in FIG. 7A, and the section view, section B-B, depicted in FIG. 7B.

Figure 8:
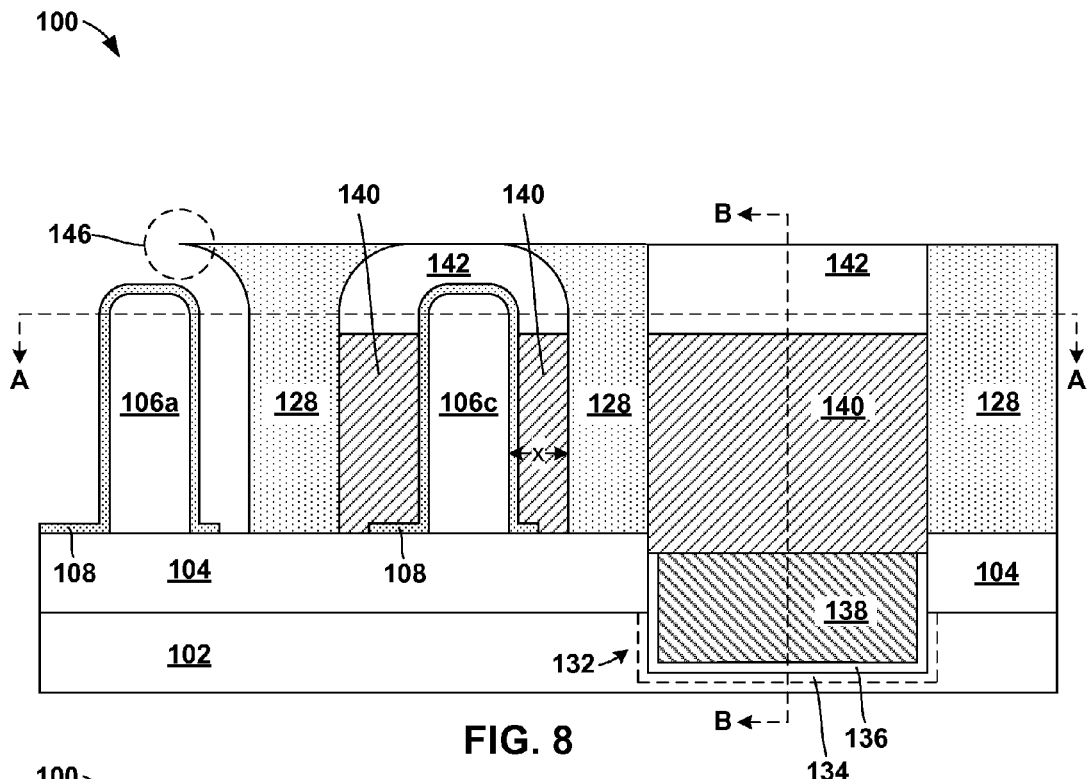
FIG. 8 illustrates the removal of a nitride layer according to an exemplary embodiment.
Figure 8A:
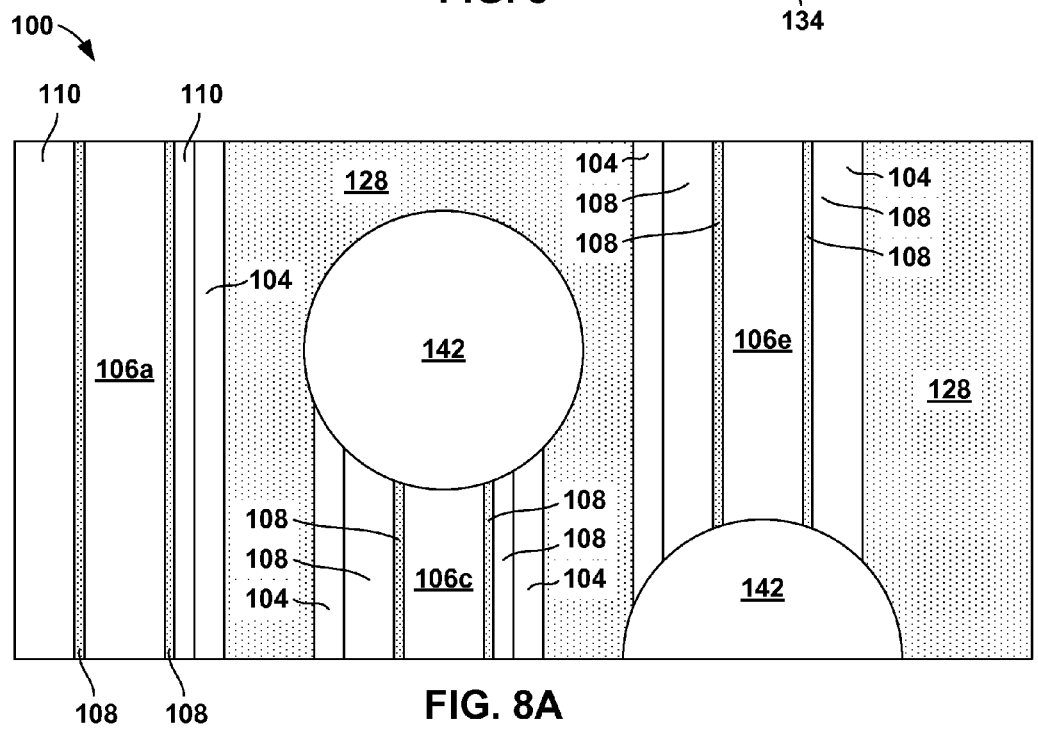
FIG. 8A depicts a section view, section A-A, of FIG. 8 according to an exemplary embodiment.

Referring now to FIG. 8, the nitride layer 110 may be selectively removed such that the oxide layer 108 and the fill material 128 remain. The selective removal may be accomplished by using any known etching technique suitable to remove nitride selective to oxide. In one embodiment, a hydrofluoric acid deglaze followed by a wet etching technique using a hot phosphorous etchant may be used to remove the nitride layer 110. A deglaze technique may be used to initially recess the fill material 128 and further expose the nitride layer 110. Removal of the nitride layer 110 may result in the fill material 128 having a re-entrant geometry 146. The re-entrant geometry 146 may prevent uniform gate formation in turn causing device reliability issues. The re-entrant geometry 146 may impede the subsequent formation of a reliable gate structure because the re-entrant geometry may prevent the conformal deposition of a gate material. Furthermore, the re-entrant geometry 146 may also prevent the removal of the dummy gate material. Either residual dummy gate material or insufficient gate material coverage may affect device performance and reliability. See also the section view, section A-A, depicted in FIG. 8A.

Figure 9:
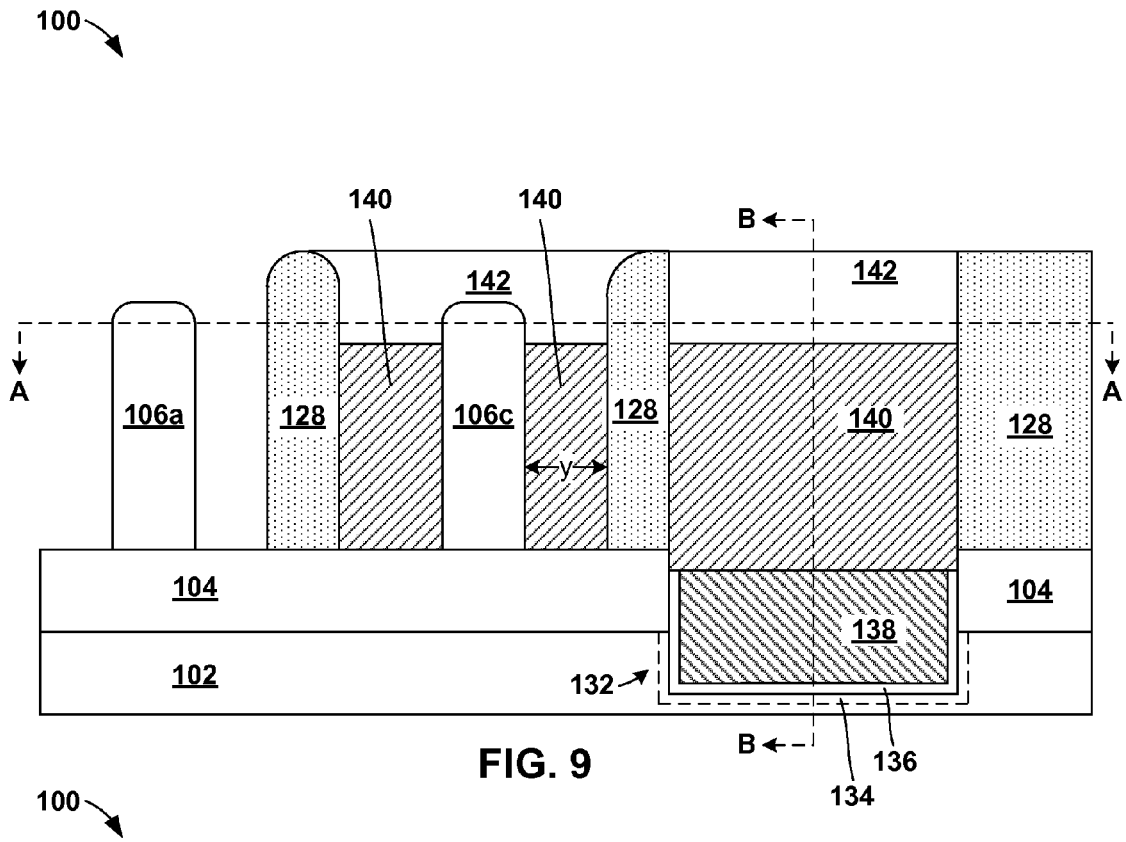
FIG. 9 illustrates a first etching technique used to remove a re-entrant feature formed in the fill material consistent with the removal of the nitride layer and remove an oxide layer from atop the fins according to an exemplary embodiment.

Referring now to FIG. 9, a first etching technique may be applied to address the undesirable re-entrant geometry 146 (FIG. 8) of the fill material 128, and remove some or all of the oxide layer 108. Preferably the cleaning technique may remove the re-entrant geometry 146 (FIG. 8). In one embodiment, a known chemical oxide removal (COR) etching technique may be used to remove the re-entrant geometry 146 (FIG. 8).

The COR technique used may include exposing the structure 100 to a gaseous mixture of HF and ammonia, preferably in a ratio of 2:1, at a pressure between 1 mTorr and 10 mTorr and a temperature of about 25° C. During this exposure, the HF and ammonia gases react with the fill material 128 to form a solid reaction product. The solid reaction product may be subsequently removed by heating the structure to a temperature of about 100° C., thus causing the reaction product to evaporate. Alternatively, the reaction product may be removed by rinsing the structure 100 in water, or removing it with an aqueous solution.

Figure 9A:
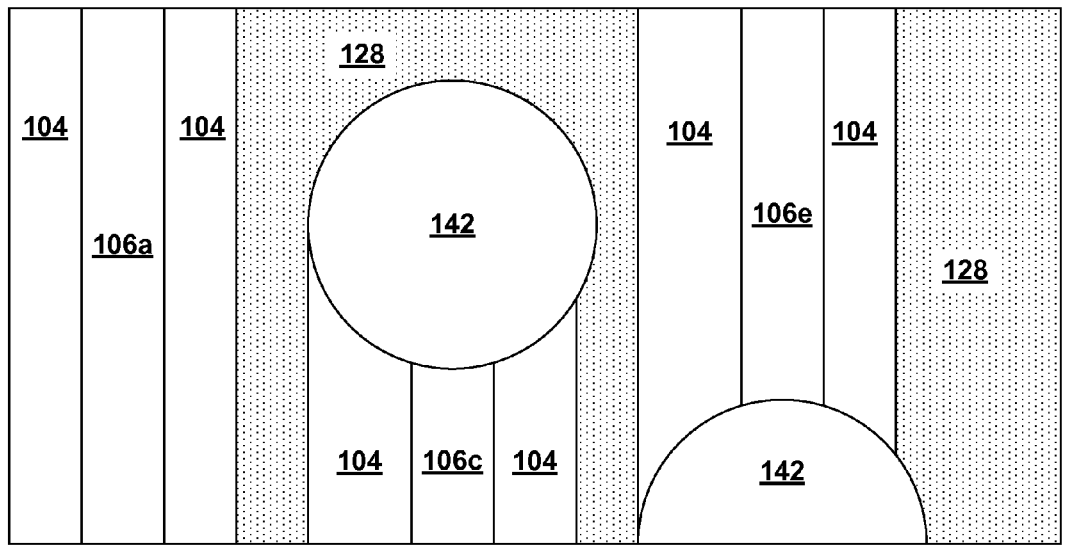
FIG. 9A depicts a section view, section A-A, of FIG. 9 according to an exemplary embodiment.

In addition to removing the re-entrant geometry 146 (FIG. 8), the COR technique may also etch a sidewall of the fill material 128. This may effectively reduce a width of the fill material 128 and increase the space between the plurality of fins 106a-106f and the fill material 128. For example, the space may be defined by the dimensions (x) in FIG. 5 and (y) in FIG. 6, where (y) is larger than (x). See also the section view, section A-A, depicted in FIG. 9A.

Figure 10:
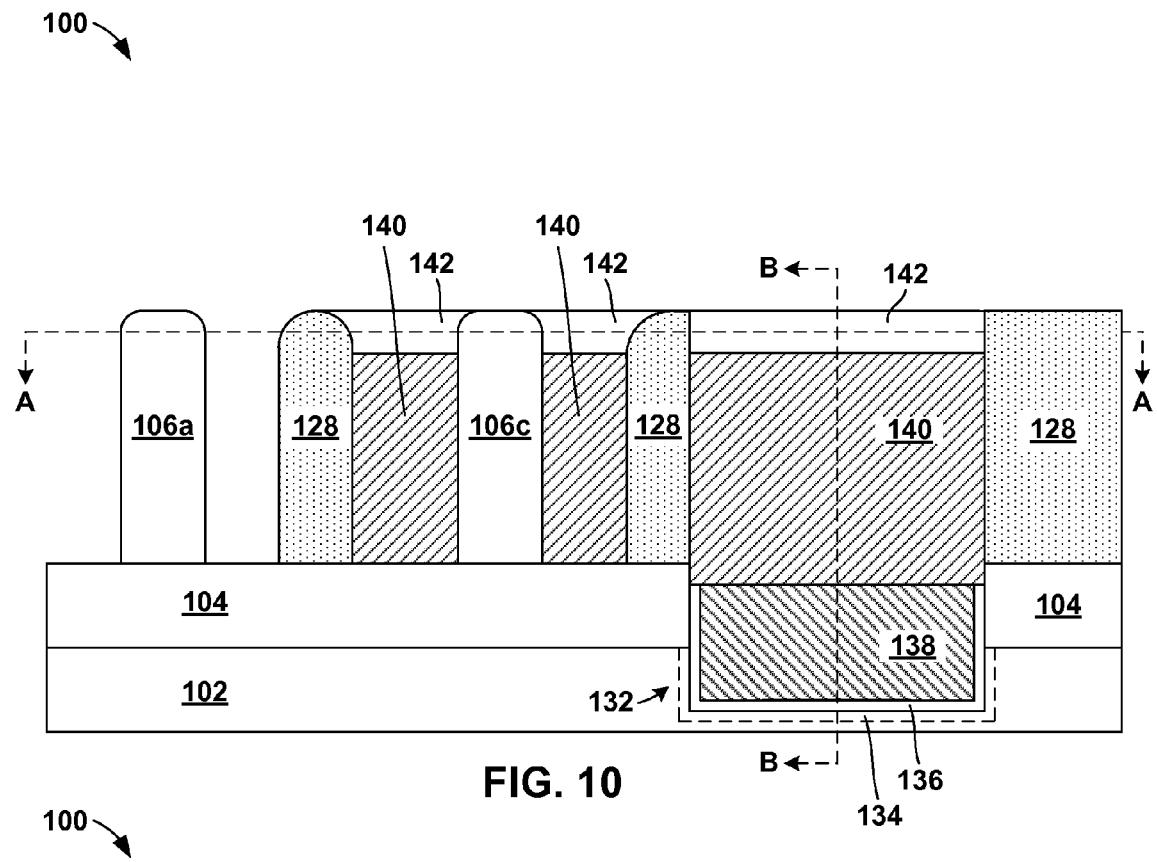
FIG. 10 illustrates a second etching technique used to remove any residual oxide layer according to an exemplary embodiment.
Figure 10A:
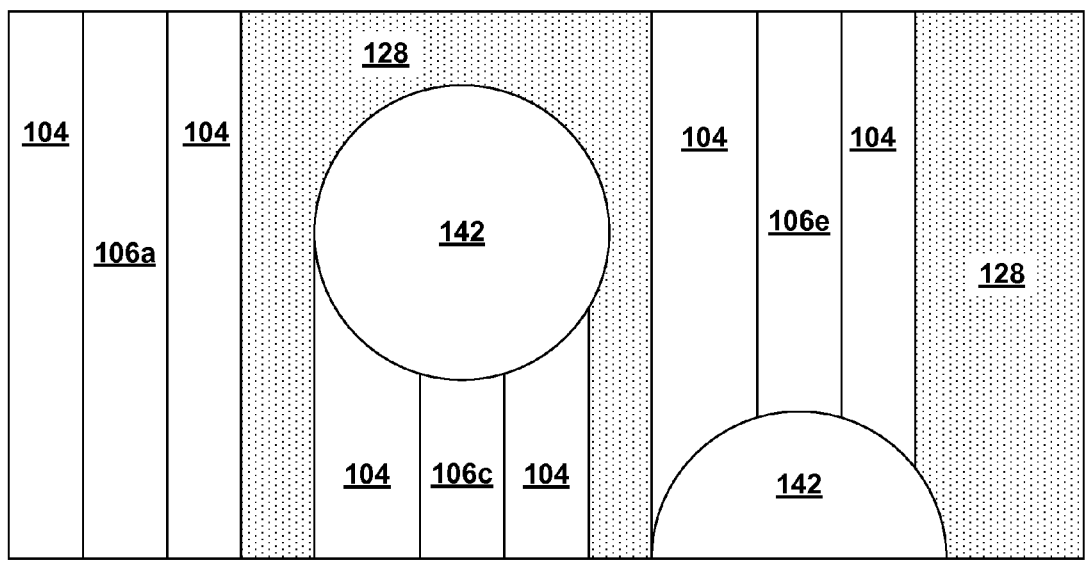
FIG. 10A depicts a section view, section A-A, of FIG. 10 according to an exemplary embodiment.

Referring now to FIG. 10, after removing the undesirable re-entrant geometry 146 (FIG. 8) a second etching technique may be used to remove any residual material of the oxide layer 108 from above the plurality of fins 106a-106f. The remaining portions of the oxide layer 108 may be removed using any known etching technique suitable to remove oxide. In one embodiment, a wet etching technique using a hydrofluoric acid etchant may be used to remove the oxide layer 108. Removal of the oxide layer 108 may result in the fill material 128 being further recessed such that a top surface of the fill material 128 may be substantially flush with a top surface of the plurality of fins 106a-106f. See also the section view, section A-A, depicted in FIG. 10A.

Figure 11:
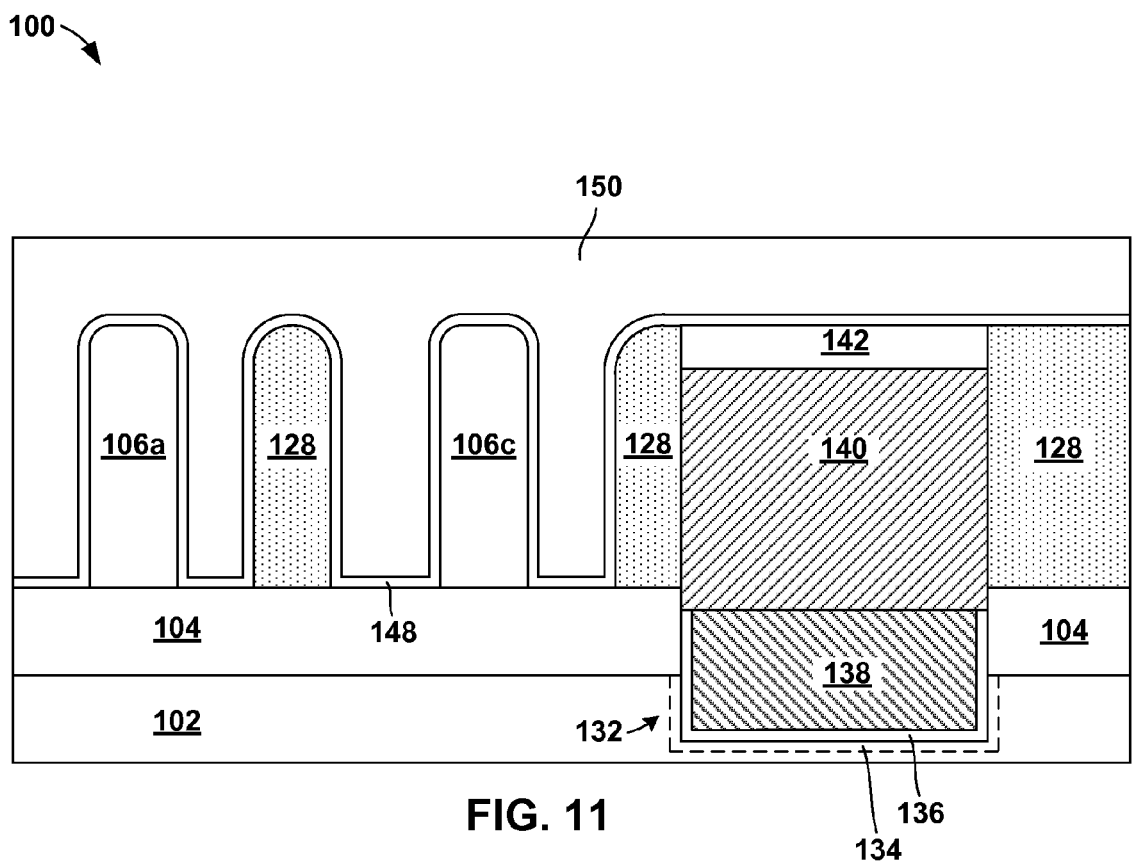
FIG. 11 illustrates the formation of a gate according to an exemplary embodiment.

Referring now to FIG. 11, next, in a RG process flow a gate may be formed on the structure 100, and typical fabrication techniques may be used to complete the formation of the semiconductor devices. The RG process flow may include the formation of a gate oxide 148, or in some cases a dummy gate oxide, and a dummy gate material 150. In most cases the dummy gate material 150 may be sacrificial and replaced in a subsequent operation. In some cases the gate oxide 148 may be sacrificial, for example the dummy gate oxide, and replaced in a subsequent operation.

Referring now to FIGS. 12-17, exemplary process steps of forming a structure 200 in accordance with one embodiment of the present invention are shown, and will now be described in greater detail below. It should be noted that FIGS. 12-17 all represent a cross section view of wafer having a plurality of fins 106a-106f formed in a semiconductor substrate. The cross section view is oriented such that a view perpendicular to the length of the plurality of fins 106a-106f is depicted.

The following embodiment is substantially similar to the above embodiment; however, the process steps illustrated and described in FIGS. 4-8 may be replaced with the process steps illustrated and described in FIGS. 12-17 according to the following embodiment. In the present embodiment, an optional oxide layer and an optional nitride layer may be incorporated into the process flow to achieve a more complete encapsulation of the deep trench capacitor with a dielectric such as oxide. This technique may be used to ensure isolation between the deep trench capacitor and a subsequently formed gate.

Like above, a cross section view, section A-A, may be provided for each figure and is designated by the corresponding figure number appended with a capitol latter 'A.' A cross section view, section B-B, may be provided for each figure and is designated by the corresponding figure number appended with a capitol latter 'B.' Also like above, it should be noted that while this description may refer to some components of the structure 200 in the singular tense, more than one component may be depicted throughout the figures and like components are labeled with like numerals. The specific number of fins depicted in the figures is for illustrative purposes only.

Figure 12:
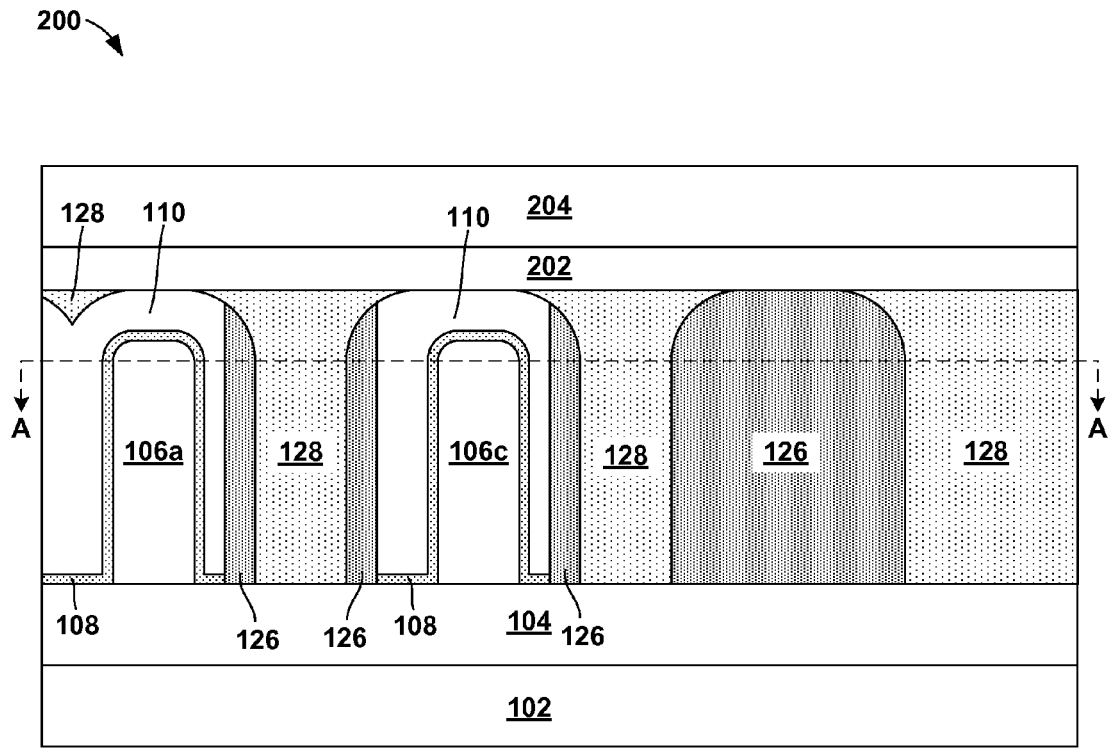
FIG. 12 illustrates the formation of an optional oxide layer and an option nitride layer according to an exemplary embodiment.

Referring now to FIG. 12, the fill material 128 may be deposited on top of the structure 200 and then planarized, as described above. Next, an optional oxide layer 202 followed by an optional nitride layer 204 may be deposited on top of the structure 200. The optional oxide layer 202 may include any suitable oxide material know in the art. In one embodiment, the optional oxide layer 202 may include a high aspect ratio oxide deposited using a CVD deposition technique. In one embodiment, the optional oxide layer 202 may have a thickness ranging from about 5 nm to about 50 nm, with 20 nm being most typical.

Figure 12A:
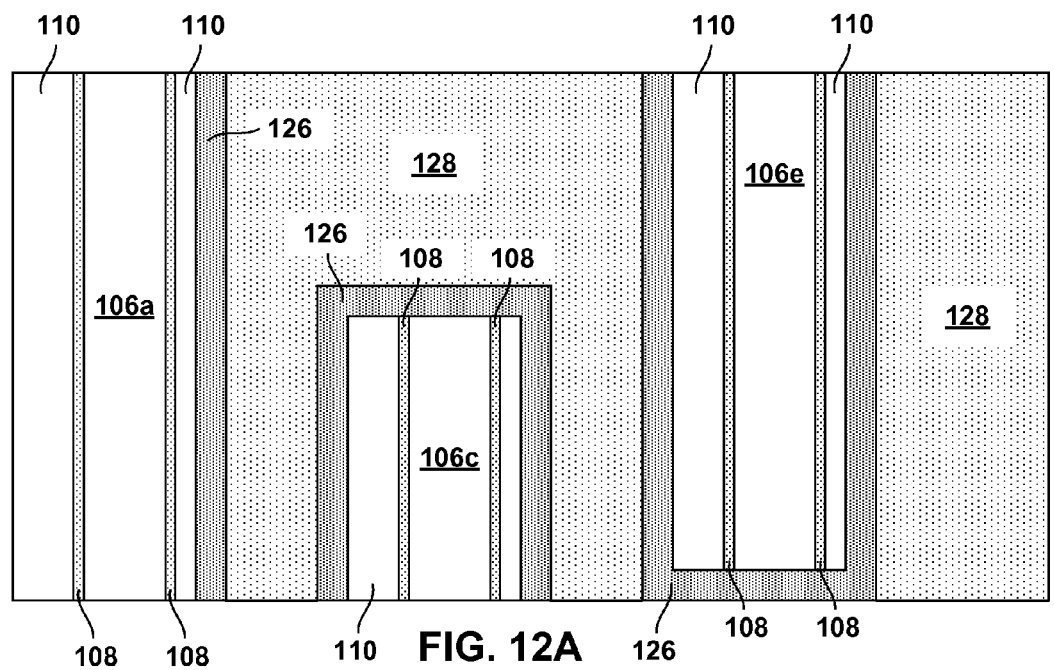
FIG. 12A depicts a section view, section A-A, of FIG. 12 according to an exemplary embodiment.

The optional nitride layer 204 may include any suitable nitride material know in the art. In one embodiment, the optional nitride layer 204 may include silicon nitride deposited using an LPCVD deposition technique. In one embodiment, the optional nitride layer 204 may have a thickness ranging from about 5 nm to about 100 nm, with 25 nm being most typical. In one embodiment, the optional nitride layer 204 may include a similar material as the nitride layer 110 and the dielectric spacer 126. Typically, the optional nitride layer 204 may include a single layer; however, the optional nitride layer 204 may include multiple layers of dielectric material. See also the section view, section A-A, depicted in FIG. 12A.

Figure 13:
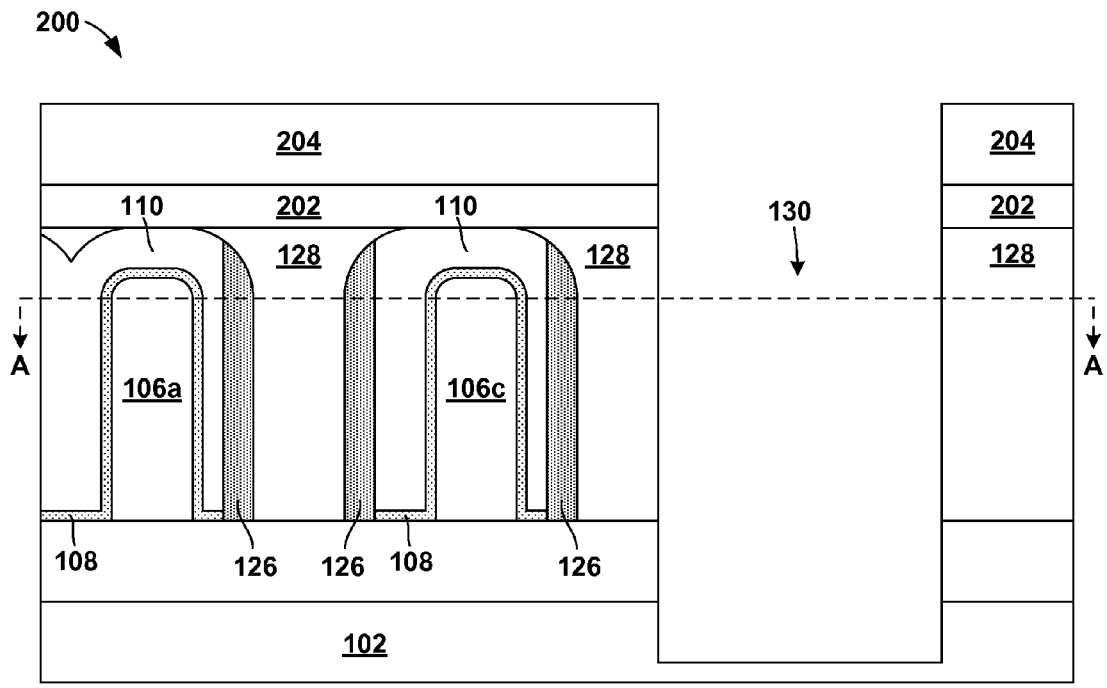
FIG. 13 illustrates the formation of a deep trench in-line with a fin according to an exemplary embodiment.
Figure 13A:
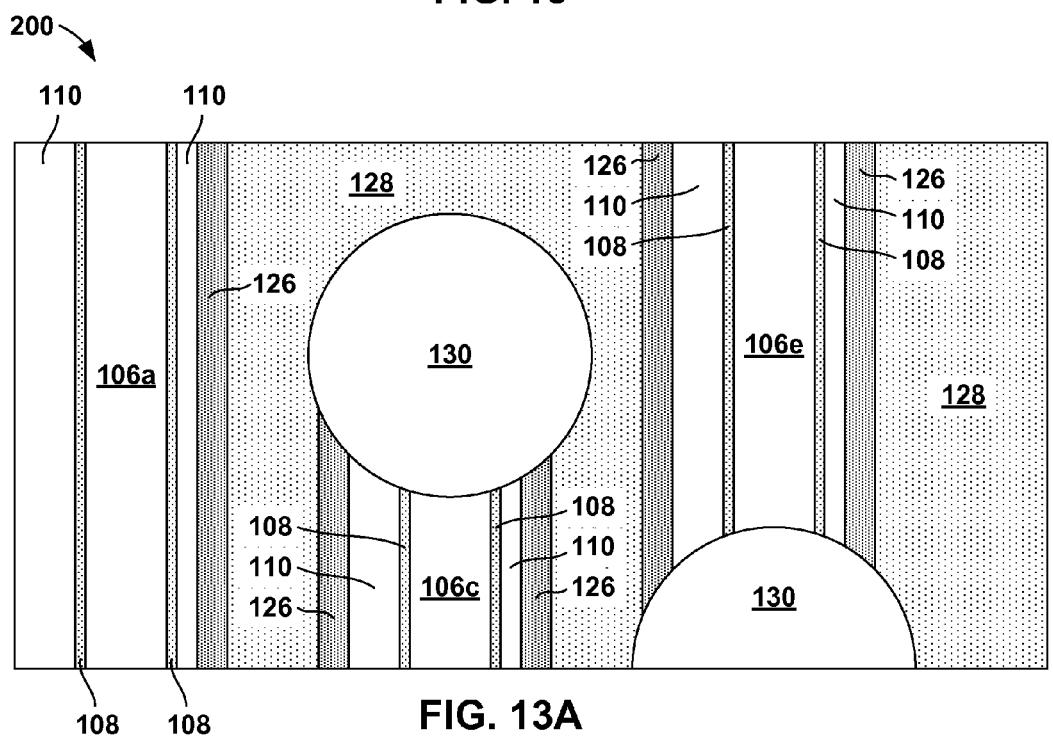
FIG. 13A depicts a section view, section A-A, of FIG. 13 according to an exemplary embodiment.

Referring to FIG. 13, the deep trench 130 may then be formed using known patterning techniques and as described above. In the present embodiment, the deep trench 130 may have a depth sufficient to pass through the optional nitride layer 204, the optional oxide layer 202 and the buried dielectric layer 104, and extend into the base substrate 102. As described in the previous embodiment, formation of the deep trench 130 directly in line with a fin may facilitate forming an electrical connection between that fin and a subsequently formed deep trench capacitor. See also the section view, section A-A, depicted in FIG. 13A.

Figure 14:
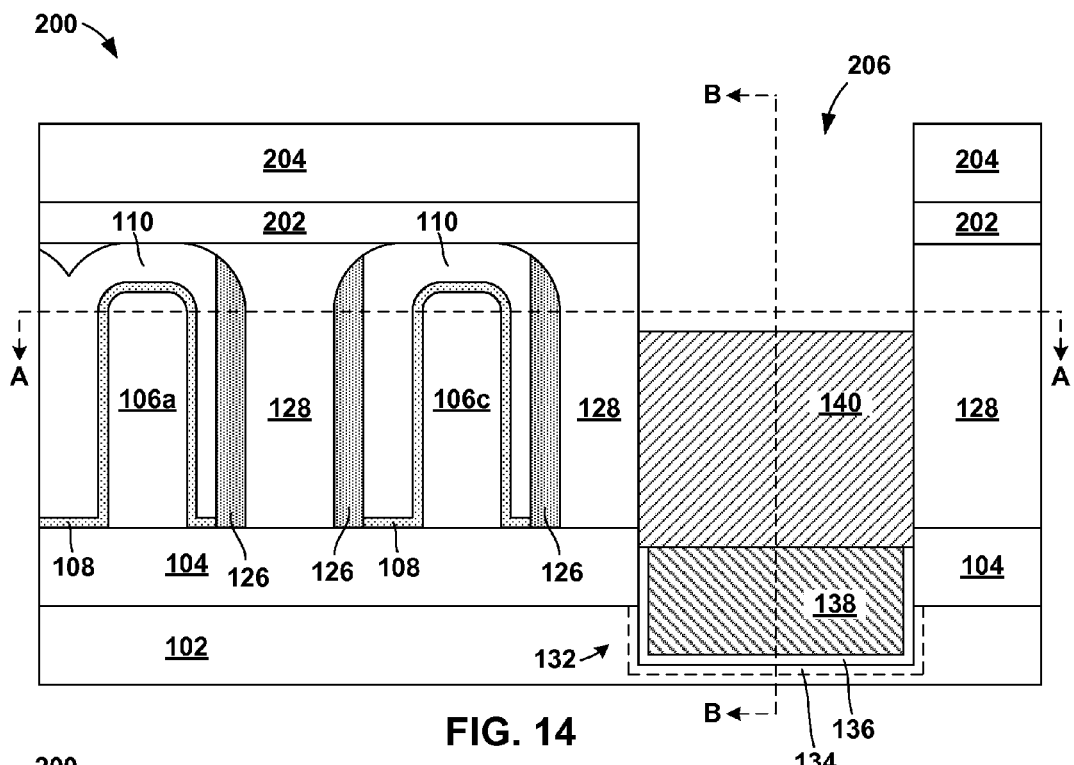
FIG. 14 illustrates the formation of a deep trench capacitor according to an exemplary embodiment.
Figure 14A:
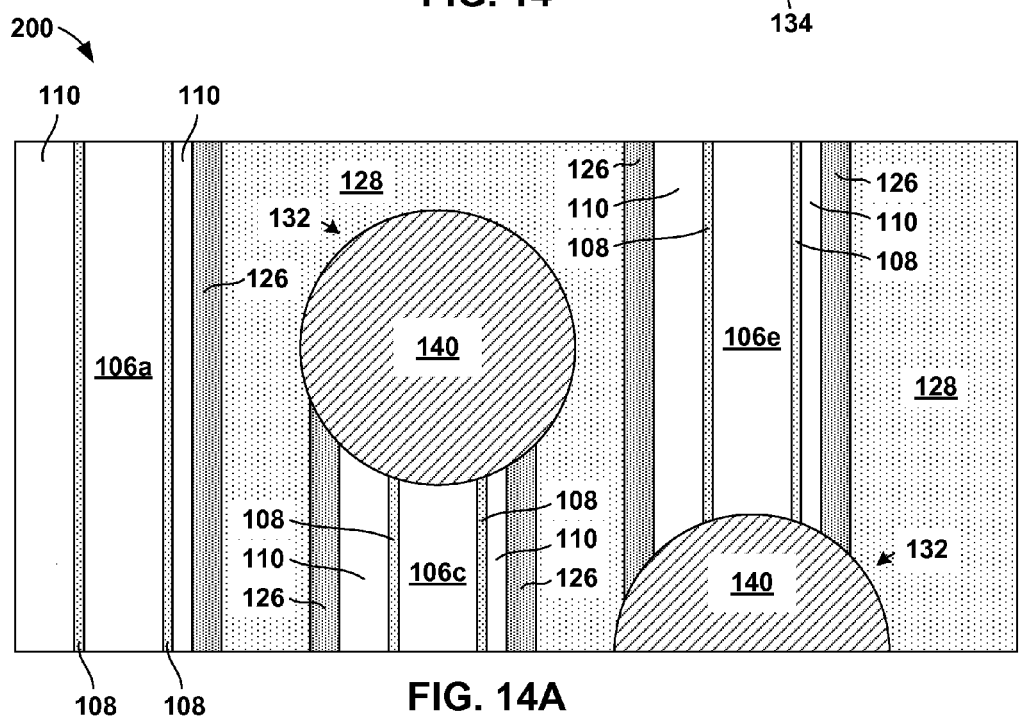
FIG. 14A depicts a section view, section A-A, of FIG. 14 according to an exemplary embodiment.
Figure 14B:
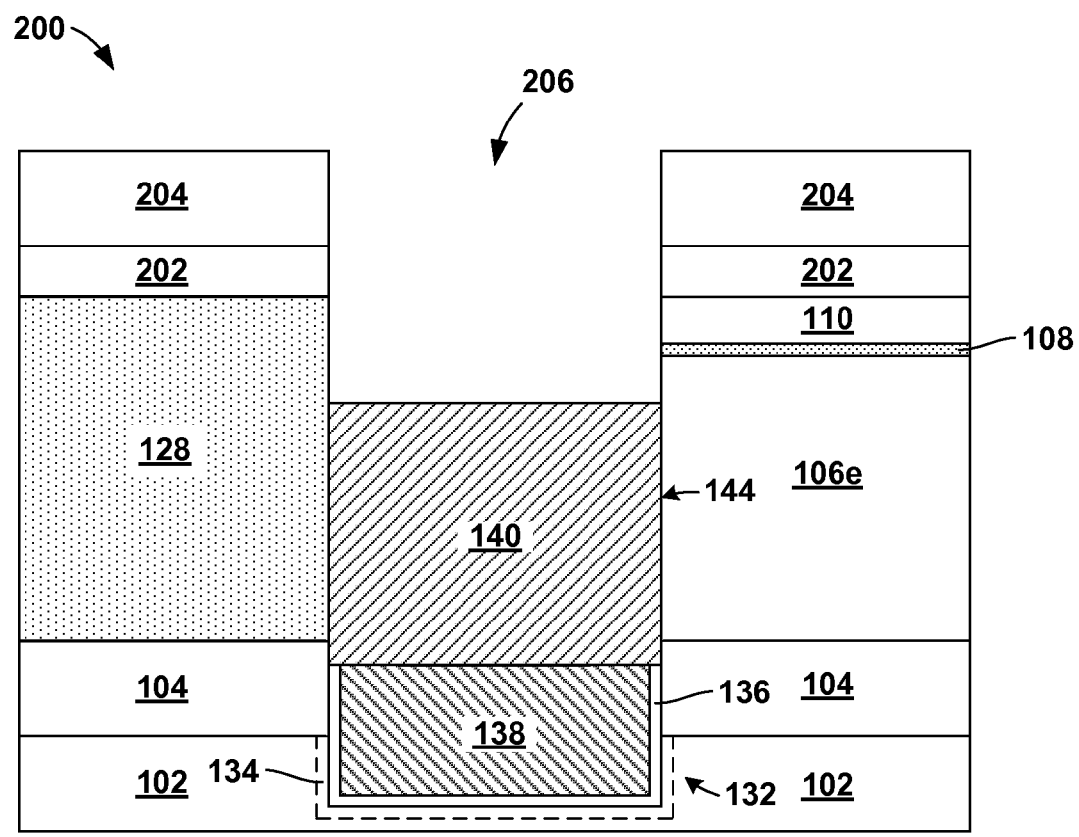
FIG. 14B depicts a section view, section B-B, of FIG. 14 according to an exemplary embodiment.

Referring to FIG. 14, the deep trench capacitor 132 may be formed in the deep trench 130, shown in FIG. 13. Like in the embodiment above, the deep trench capacitor 132 may include the buried plate 134, the node dielectric 136, the inner electrode 138, and the conductive fill material 140. The buried plate 134, the node dielectric 136, the inner electrode 138, and the conductive fill material 140 may be formed using similar techniques and with similar material as described in the above embodiment. Next, the conductive fill material 140 may be recessed to a location at or below the top surface of the plurality of fins 106a-106f using similar techniques as those described in the above embodiment. Recessing the conductive fill material 140 may produce an opening 206. See also the section view, section A-A, depicted in FIG. 14A, and the section view, section B-B, depicted in FIG. 14B.

Figure 15:
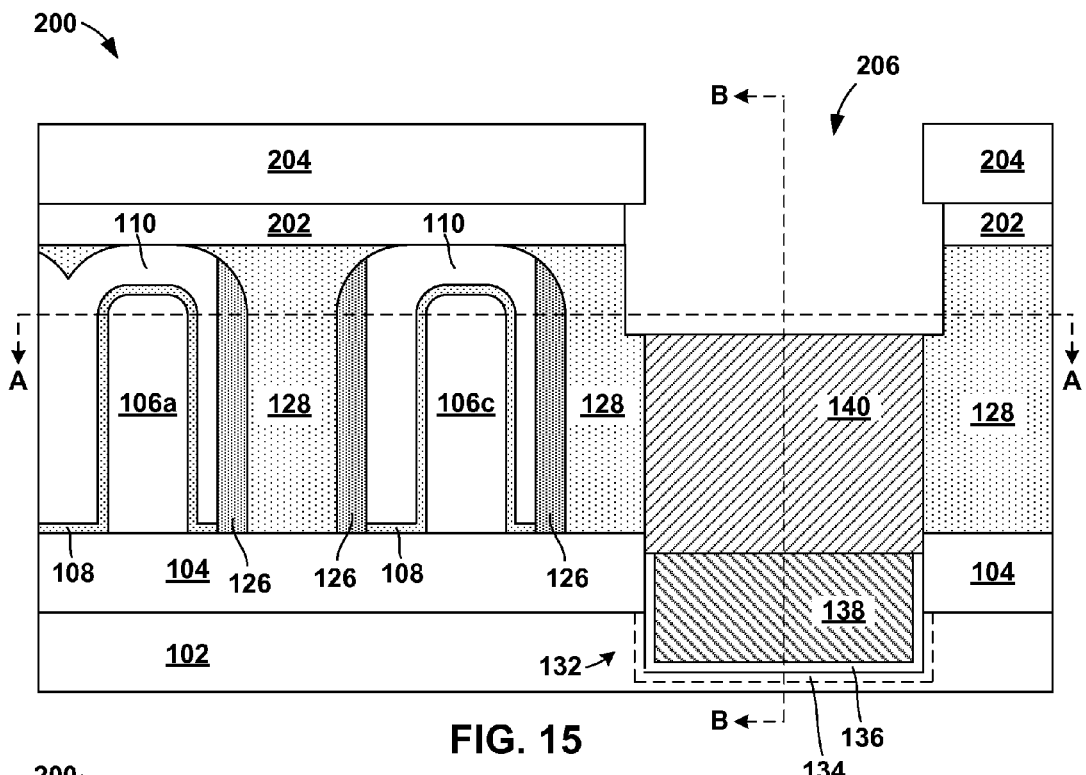
FIG. 15 depicts the removal of a portion of the optional oxide layer according to an exemplary embodiment.
Figure 15A:
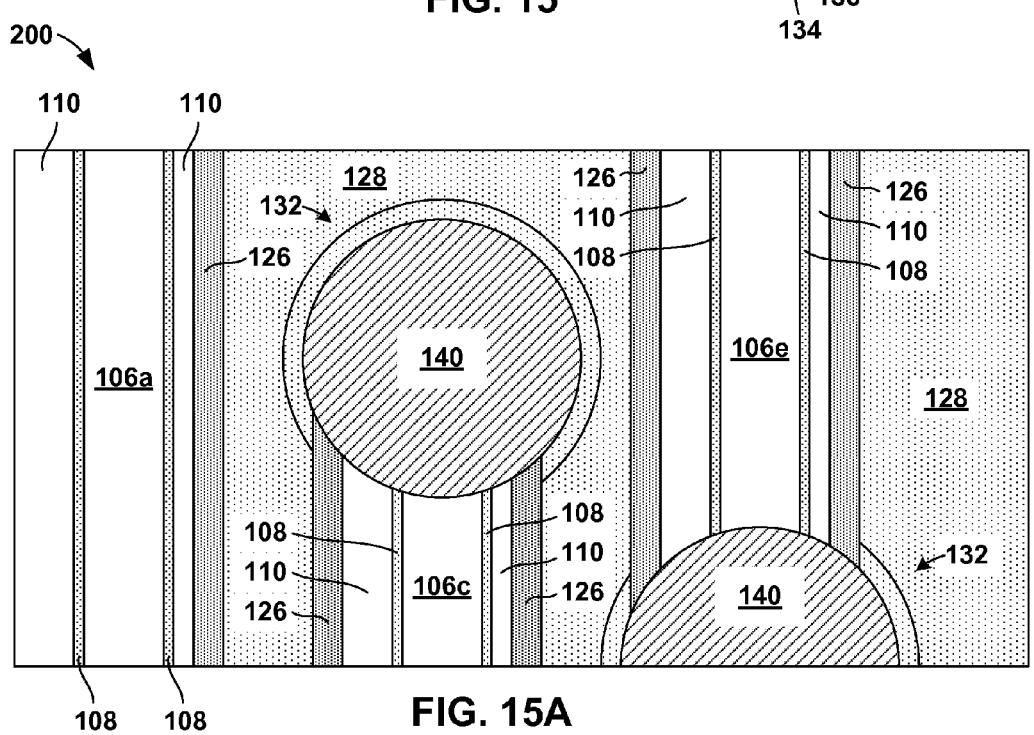
FIG. 15A depicts a section view, section A-A, of FIG. 15 according to an exemplary embodiment.
Figure 15B:
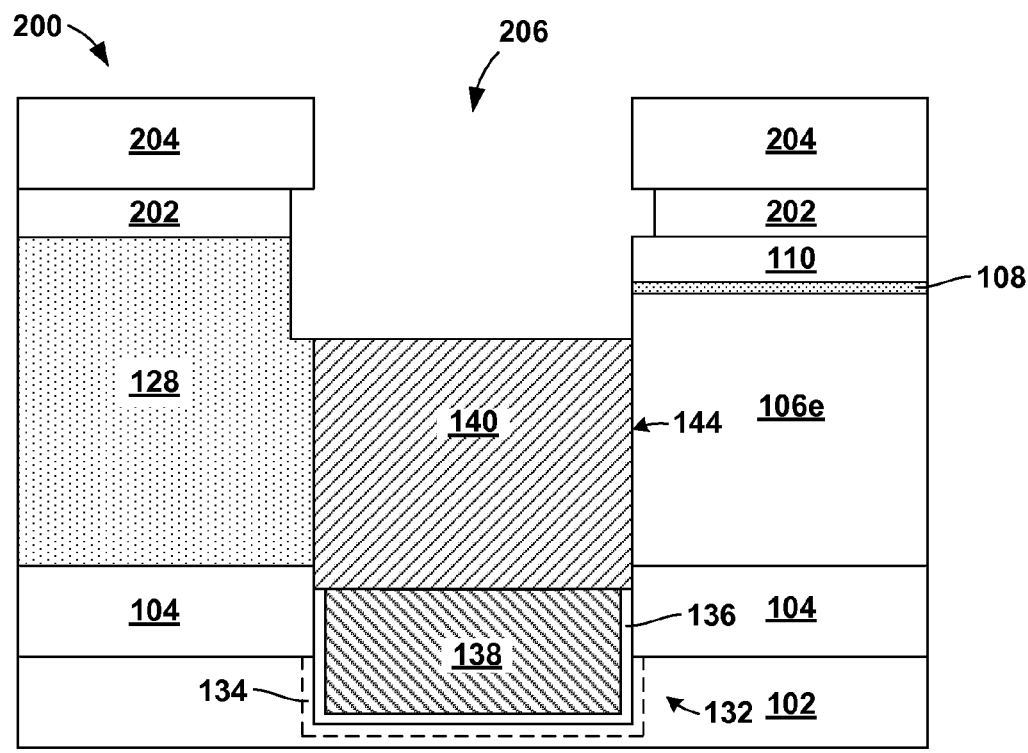
FIG. 15B depicts a section view, section B-B, of FIG. 15 according to an exemplary embodiment.

Referring to FIG. 15, unlike the above embodiment, a portion of the fill material 128 and a portion of the optional oxide layer 202 which form a sidewall of the opening 206 may be selectively removed. The selective removal may be accomplished by using any known etching technique suitable to remove oxide selective to nitride. In one embodiment, a wet etching technique using a hydrofluoric acid etchant may be used to remove the portion of the fill material 128 and the portion of the optional oxide layer 202. Removal of the portion of the fill material 128 and the portion of the optional oxide layer 202 may result in the opening 206 having a larger width in the area of the fill material 128 and the optional oxide layer 202; however, the width of the opening 206 may remain unchanged in the area of the optional nitride layer 204. In one embodiment, the wet etching technique may increase the width of the opening 206 in the area of the fill material 128 and the optional oxide layer 202 by about 3 nm to about 20 nm. See also the section view, section A-A, depicted in FIG. 15A, and the section view, section B-B, depicted in FIG. 15B.

Figure 16:
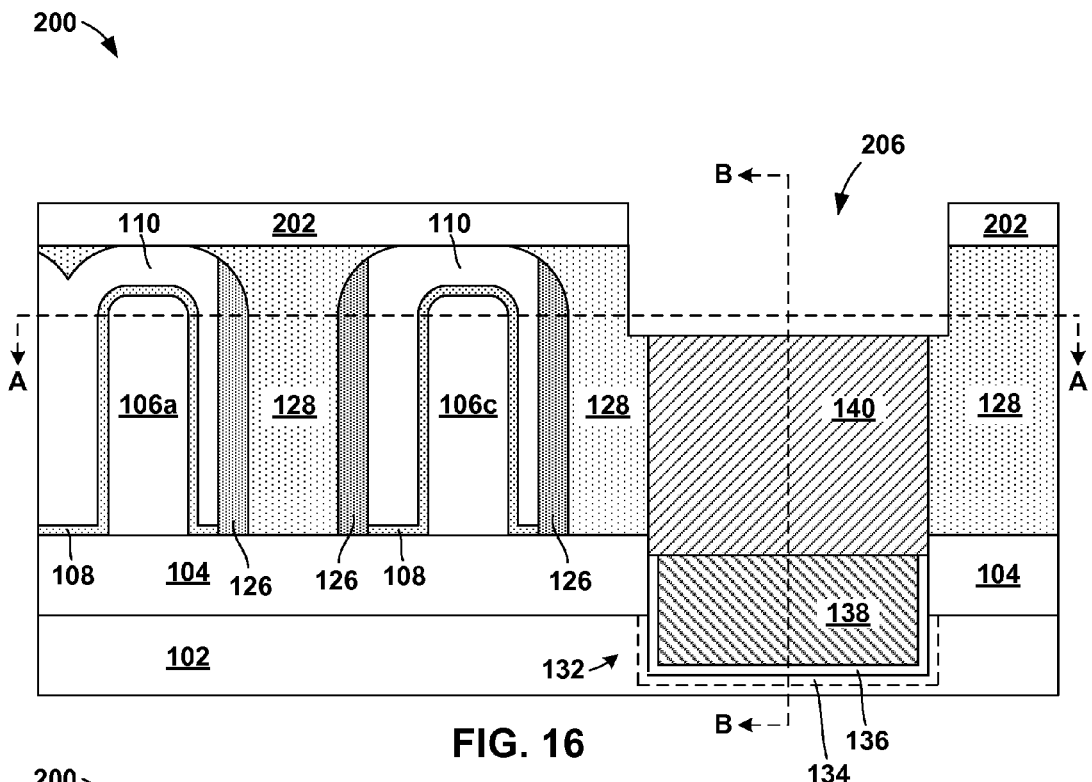
FIG. 16 illustrates the removal of the optional nitride layer according to an exemplary embodiment.
Figure 16A:
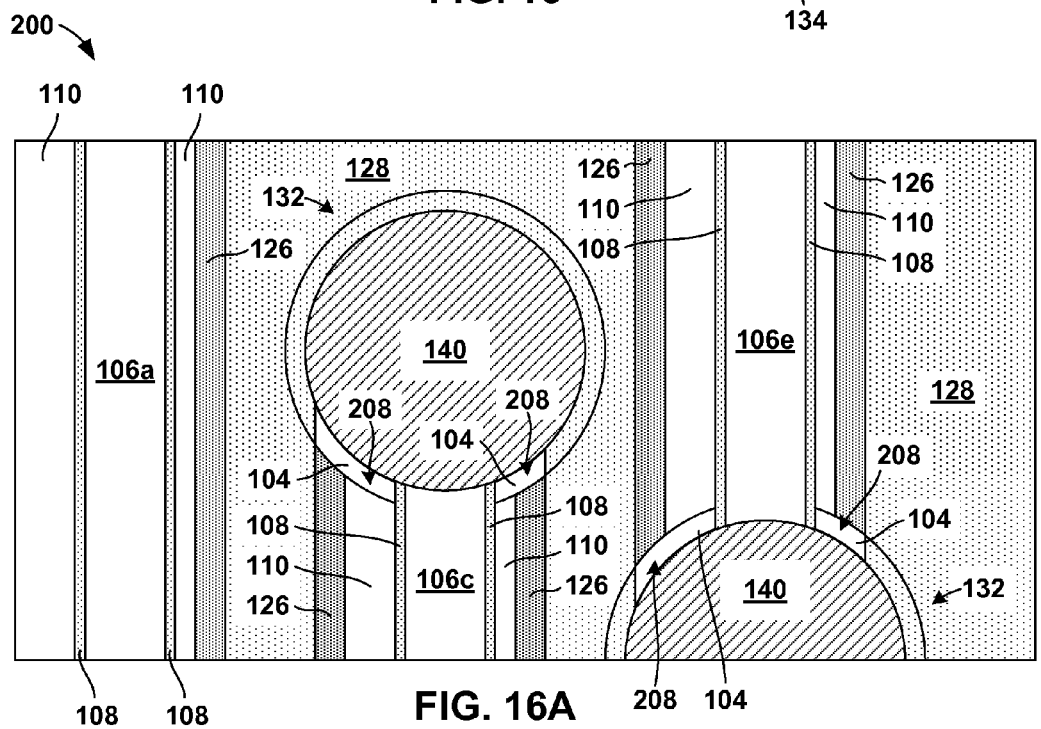
FIG. 16A depicts a section view, section A-A, of FIG. 16 according to an exemplary embodiment.
Figure 16B:
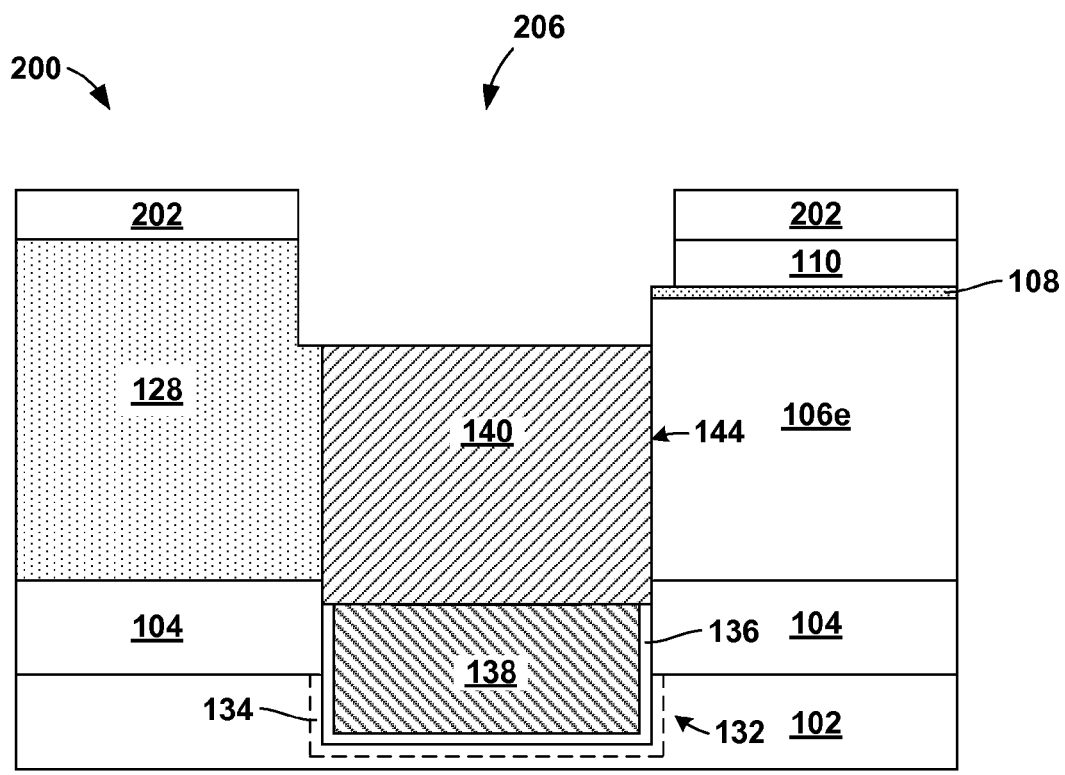
FIG. 16B depicts a section view, section B-B, of FIG. 16 according to an exemplary embodiment.

Referring to FIG. 16, a portion of the nitride layer 110 and the optional nitride layer 204 may be selectively removed. The selective removal may be accomplished by using any known etching technique suitable to remove nitride selective to oxide. In a preferred embodiment, a dry etching technique, for example reactive ion etching, using a $C_xH_yF_z/H_2$ based etchant may be used to remove the portion of the nitride layer 110 and the optional nitride layer 204. In another embodiment, a wet etching technique using a hot phosphorous etchant may be used to remove the portion of the nitride layer 110 and the optional nitride layer 204, however, the wet etch may have an undercutting affect not realized with the dry etch. Alternatively, in another embodiment, the wet etch and the dry etch may be used in combination. It should be noted that the optional nitride layer 204 may be removed in full while only a portion of the nitride layer 110 exposed in the opening 206 may be removed with the above etching technique. Removal of the portion of the nitride layer 110 may create a void 208. The void 208 may extend from a top surface of the conductive fill material 140 along the depth of the deep trench capacitor 132 to the buried dielectric layer 104. See also the section view, section A-A, depicted in FIG. 16A, and the section view, section B-B, depicted in FIG. 16B.

Figure 17:
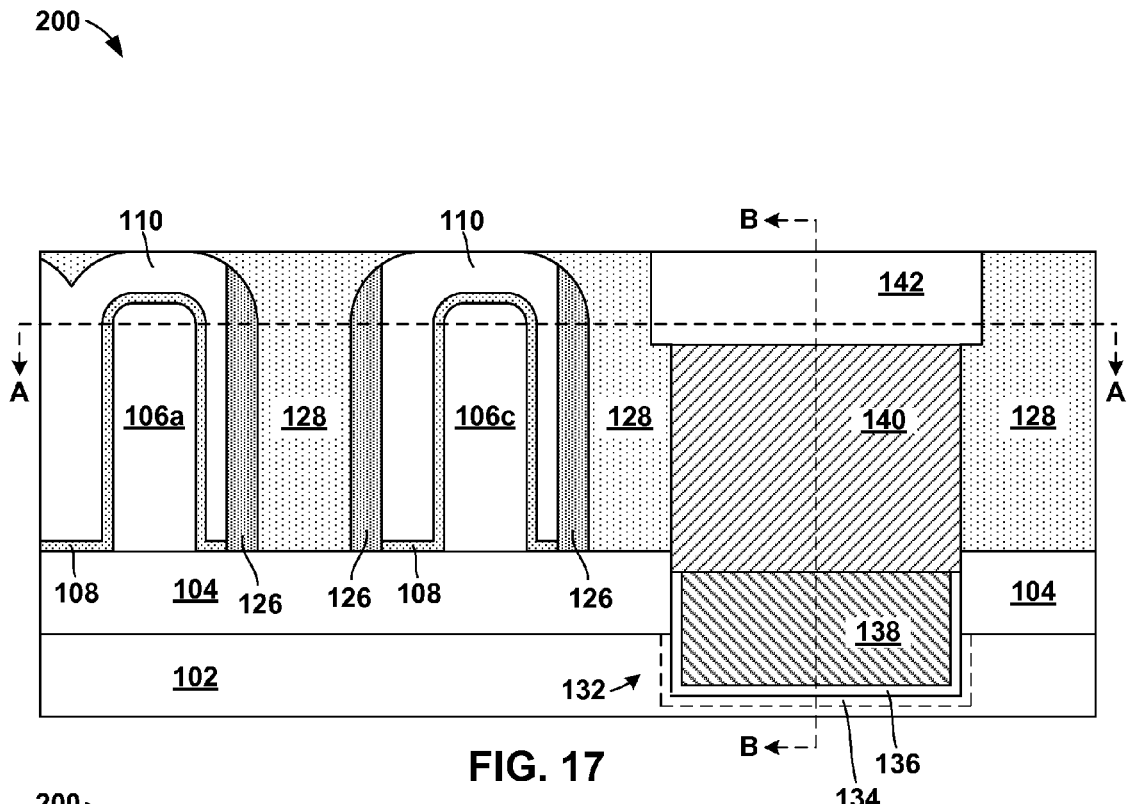
FIG. 17 depicts the formation of a dielectric cap above the deep trench capacitor according to an exemplary embodiment.
Figure 17A:
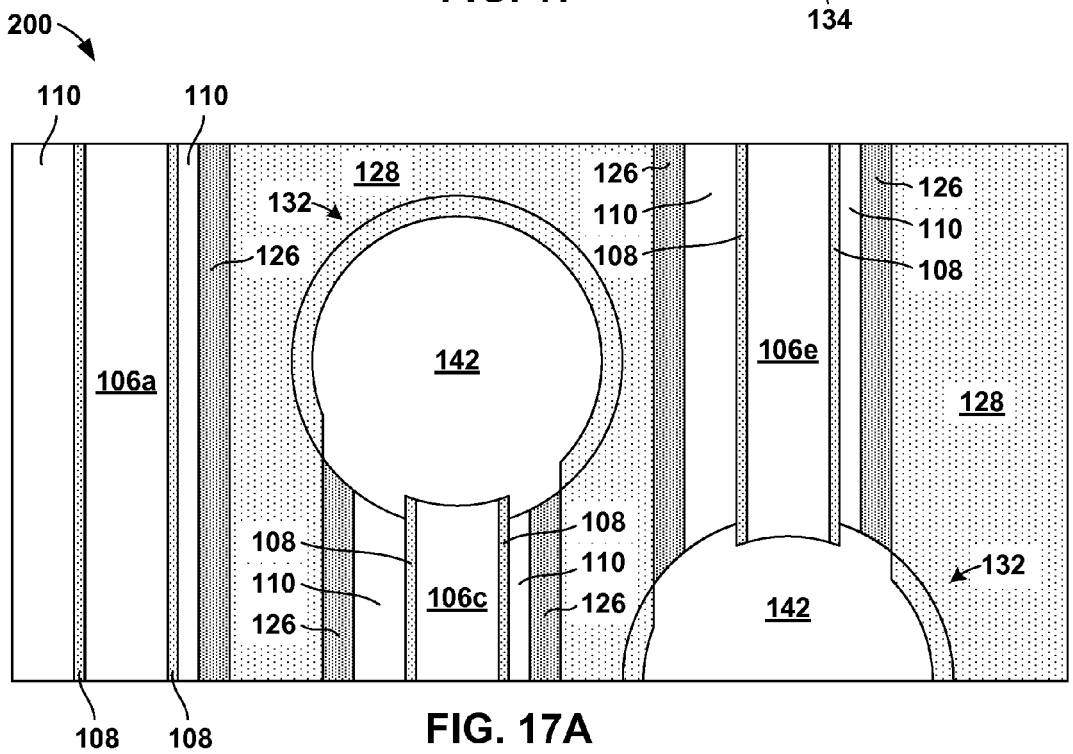
FIG. 17A depicts a section view, section A-A, of FIG. 17 according to an exemplary embodiment.
Figure 17B:
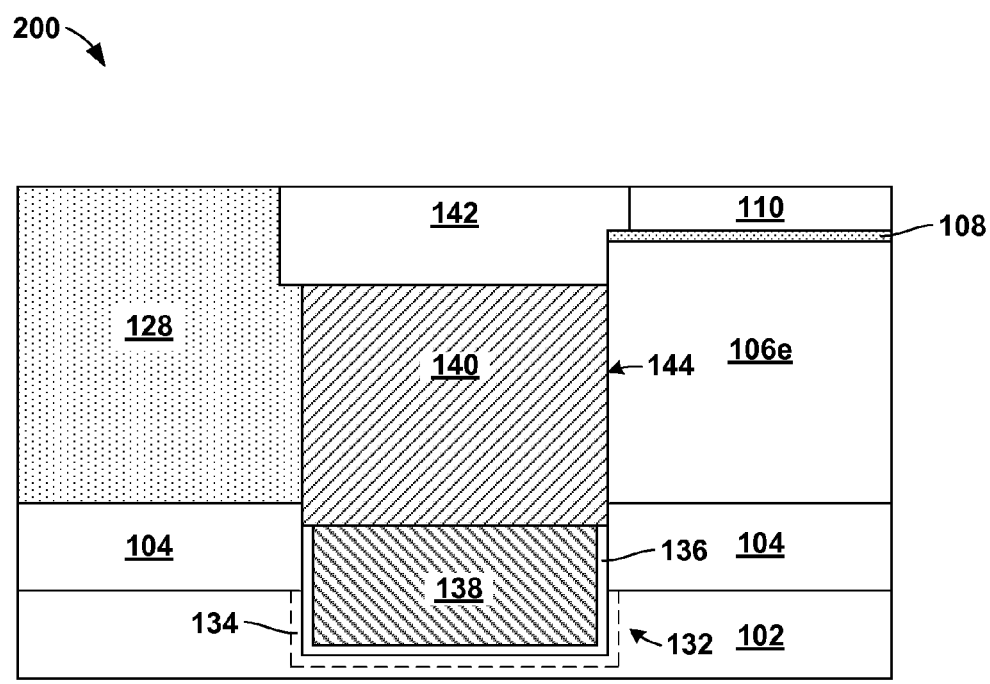
FIG. 17B depicts a section view, section B-B, of FIG. 17 according to an exemplary embodiment.

Referring now to FIG. 17, next, the dielectric cap 142 may be formed at the top of the deep trench capacitor 132. The dielectric cap 142 may be formed from the same materials, using the same techniques, and have the came characteristics as described in the above embodiment. In the present embodiment, the material of the dielectric cap 142 not only covers a top surface of the deep trench capacitor 132, but also fills the void 208 created on a side of the deep trench capacitor 132 created by the selective removal of the portion of the nitride layer 110. See also the section view, section A-A, depicted in FIG. 17A, and the section view, section B-B, depicted in FIG. 17B. As previously described, the present embodiment may further include the process steps illustrated and described in FIGS. 8-11.

Figure 18:
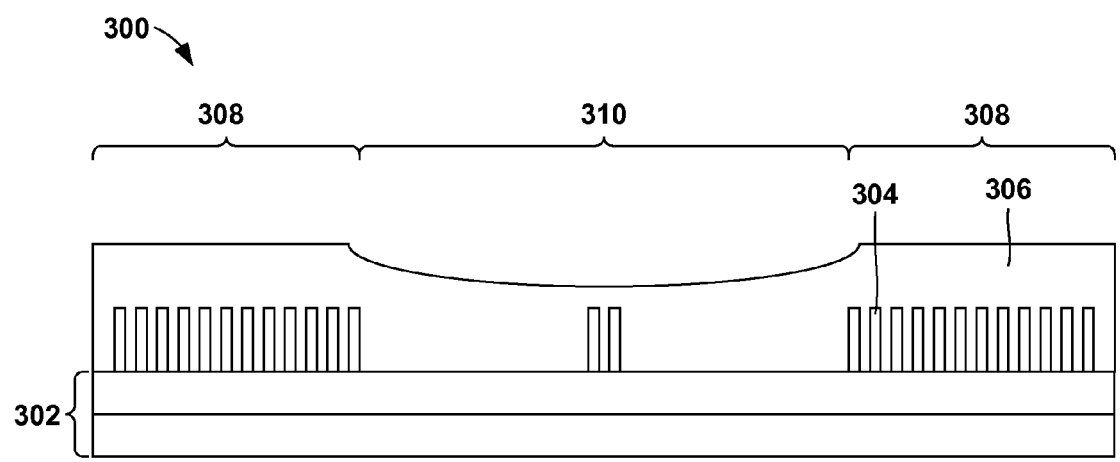
FIG. 18 illustrates the affect varying pattern densities have on the planarity of a blanket gate material according to an exemplary embodiment.

Referring now to FIG. 18, a cross section view of a structure 300 having varying pattern densities is shown. The structure 300 may include a substrate 302, fins 304, and a blanket gate material layer 306. The gate material layer may include a blanket dummy gate material as used in a RG process flow, or a blanket layer of gate material as used in a gate first process flow. Furthermore, the structure 300 may include regions of high pattern density, for example regions 308, and regions of low pattern density, for example regions 310. As mentioned above regions of high pattern density may include a larger number of fins as opposed to regions of low pattern density.

The affect pattern density may have on the planarity of the blanket gate material layer 306 is shown. The thickness or height of the blanket gate material layer 306 may be thicker, or taller, in the regions of high pattern density. It should be noted that an oxide layer, like the oxide layer 108 depicted in FIGS. 1-17, is omitted from FIG. 18 for illustrative purpose only. The processes and techniques described in the above embodiments may be designed to improve planarity and may advantageously eliminate the non-planer surface of a fill material, for example the blanket layer of gate material, caused by the variations in pattern density.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
providing a plurality of fins etched from a semiconductor substrate and covered by an oxide layer and a nitride layer, the oxide layer being located between the plurality of fins and the nitride layer;
removing a portion of the plurality of fins to form an opening;
forming a dielectric spacer on a sidewall of the opening;
filling the opening with a fill material, wherein a top surface of the fill material is substantially flush with a top surface of the nitride layer;
forming a deep trench capacitor in-line with one of the plurality of fins;
removing the nitride layer to form a gap between the plurality of fins and the fill material, wherein the fill material has re-entrant geometry extending over the gap; and
removing the re-entrant geometry and causing the gap between the plurality of fins and the fill material to widen.

2. The method of claim 1, further comprising:
removing the oxide layer; and
recessing the fill material such that the top surface of the fill material is substantially flush with a top surface of the fins.

3. The method of claim 2, further comprising:
forming a gate above and between the plurality of fins and the fill material.

4. The method of claim 1, wherein forming the gate comprises using a gate first or a replacement gate process flow.

5. The method of claim 1, wherein filling the opening with a fill material comprises depositing an oxide.

6. The method of claim 1, wherein providing a plurality of fins etched from a semiconductor substrate comprises providing a bulk substrate or a semiconductor-on-insulator substrate.

7. The method of claim 1, wherein forming the deep trench capacitor further comprises:
forming a deep trench
forming a buried plate;
forming a node dielectric, and
forming an inner electrode.

* * * * *